(12) United States Patent
Chang et al.

(10) Patent No.: US 10,097,156 B2
(45) Date of Patent: Oct. 9, 2018

(54) RESONANCE STRUCTURE OF BULK ACOUSTIC WAVE RESONATOR

(71) Applicant: WIN Semiconductors Corp., Tao Yuan (TW)

(72) Inventors: Chia-Ta Chang, Tao Yuan (TW); Re Ching Lin, Tao Yuan (TW); Yung-Chung Chin, Tao Yuan (TW); Chih-Feng Chiang, Tao Yuan (TW)

(73) Assignee: WIN SEMICONDUCTORS CORP., Tao Yuan (TW)

( * ) Notice: Subject to any disclaimer, the term of this patent is extended or adjusted under 35 U.S.C. 154(b) by 128 days.

(21) Appl. No.: 15/228,298

(22) Filed: Aug. 4, 2016

(65) Prior Publication Data

US 2017/0294893 A1 Oct. 12, 2017

(30) Foreign Application Priority Data

Apr. 11, 2016 (TW) .............................. 105111255 A

(51) Int. Cl.
*H03H 9/13* (2006.01)
*H03H 9/17* (2006.01)
*H03H 9/02* (2006.01)

(52) U.S. Cl.
CPC ...... *H03H 9/02157* (2013.01); *H03H 9/0211* (2013.01); *H03H 9/02118* (2013.01); *H03H 9/132* (2013.01); *H03H 9/17* (2013.01)

(58) Field of Classification Search
CPC .. H03H 9/0211; H03H 9/02157; H03H 9/132; H03H 9/17; H03H 9/02118; H03H 9/171

USPC .................. 333/187, 189; 310/321, 322, 365
See application file for complete search history.

(56) References Cited

U.S. PATENT DOCUMENTS

| 6,693,500 | B2 * | 2/2004 | Yang | ...................... H03H 9/173 310/365 |
| 6,914,368 | B2 * | 7/2005 | Nakamura | ......... H03H 9/02015 310/324 |
| 7,636,027 | B2 * | 12/2009 | Mori | ..................... H03H 9/0211 310/334 |

FOREIGN PATENT DOCUMENTS

| DE | 10 2004 053 318 A1 | * | 5/2006 |
| JP | 2005-033262 A | * | 2/2005 |
| JP | 2005-318366 A | * | 11/2005 |
| JP | 2008-172638 A | * | 7/2008 |

OTHER PUBLICATIONS

English language machine translation of JP 2005-033262 A, published Feb. 3, 2005, 7 pages.*
(Continued)

*Primary Examiner* — Barbara Summons
(74) *Attorney, Agent, or Firm* — Muncy, Geissler, Olds & Lowe, P.C.

(57) ABSTRACT

A resonance structure of bulk acoustic wave resonator comprises a bottom electrode, a dielectric layer and a top electrode, wherein the dielectric layer is formed on the bottom electrode; the top electrode is formed on the dielectric layer. A resonance area is defined by the overlapping area of the projection of the bottom electrode, the dielectric layer and the top electrode. The resonance area has a contour. The contour includes at least three curved edges and is formed by connecting the at least three curved edges. Each curved edge is concave to a geometric center of the contour.

31 Claims, 26 Drawing Sheets

(56) References Cited

OTHER PUBLICATIONS

Images of online calulators of sagitta of circular arcs subscribed by equilateral triangles from online cites http://www.cse.unsw.edu.au/en1811/10s2/assigns/ass2/sagitta.png and https//i.ytimg.com/vi/oDju00aZ4Uk/hqdefault.jpg, downloaded Feb. 6, 2018, 2 pages.*
Image of the structure of a Reuleaux Circle from cite http://mathworld.wolfram.com/images/eps-gif/ReuleauxCircles_700.gif downloaded Feb. 6, 2018, 1 page.*
English language machine translation of JP 2005-318366 A, published Nov. 10, 2005, 9 total pages with abstract.*

* cited by examiner

RESONANCE STRUCTURE OF BULK ACOUSTIC WAVE RESONATOR

FIELD OF THE INVENTION

The present invention relates to a resonance structure of bulk acoustic wave resonator, especially a resonance structure of bulk acoustic wave resonator having a contour formed by at least three curved edges.

BACKGROUND OF THE INVENTION

Bandpass filter used in the global communication systems, especially the bulk acoustic wave resonator (BAW Resonator) having the operating frequency suitable for above 2 GHz. Please refer to FIGS. 9A and 9B, which show the sectional schematic views of the bulk acoustic wave resonator of conventional technology and demonstrate the schematic diagrams of the vibration of the piezoelectric material in the vertical direction inducing the vibration in the horizontal direction. The structure of the bulk acoustic wave resonator 14 usually provides a piezoelectric material 12 sandwiched by a bottom electrode 11 and a top electrode 13. Applying an electric field between the top electrode 13 and the bottom electrode 11, utilizing the characteristics of the piezoelectric material, to convert electrical energy into mechanical energy for generating the vertical wave resonance effect in vertical direction such that the high frequency impedance in certain frequency range is very small, therefore the purpose of bandpass filtering is achieved while combining several resonators. However the vibration of the piezoelectric material 12 in vertical direction usually accompanies with the vibration in horizontal direction, thereby the lateral wave is induced. FIG. 9A shows that when the piezoelectric material 12 is extending along the vertical direction, the compression of the piezoelectric material 12 along horizontal direction is accompanied. While FIG. 9B shows that when the piezoelectric material 12 is compressed along the vertical direction, the extension of the piezoelectric material 12 along horizontal direction is accompanied. Furthermore, please also refer to FIG. 9C, which shows the sectional schematic view of the bulk acoustic wave resonator of conventional technology and demonstrates the schematic diagram of the electric field applied between the top electrode and the bottom electrode. The electric field applied between the top electrode 13 and the bottom electrode 11 has the horizontal component near the boundary of the contour of the bulk acoustic wave resonator 14, thereby the electrical energy of the piezoelectric material 12 in horizontal direction is converted into mechanical energy to induce the lateral wave in horizontal direction.

Please refer to FIG. 9D, FIG. 9E and FIG. 9F, which show the top views of the bulk acoustic wave resonator of conventional technology and demonstrate the schematic diagrams of three types of resonance states of the lateral wave respectively. The lateral wave caused by the two factors mentioned the above after total reflection within the bulk acoustic wave resonator may have the opportunity to reach the lateral wave resonance effect in horizontal direction. The later wave resonance effect also called spurious mode. FIG. 9D shows that the lateral wave within the contour 15 (a rectangle contour) of the bulk acoustic wave resonator of conventional technology reaches the resonance state in the left and right direction. FIG. 9E shows that the lateral wave within the contour 15 reaches the resonance state in the forward and backward direction. FIG. 9E shows that the lateral wave within the contour 15 reaches another type of resonance state after total reflection. If the frequency of the later wave resonance effect is too close to the frequency of the vertical wave resonance, then the vertical wave resonance effect will be interfered such that the filter characteristic of the bulk acoustic wave resonator 14 is impacted. Please refer to FIG. 9G, which shows the frequency response graph of the bulk acoustic wave resonator of conventional technology. $S_{11}$ is the ratio of the transmission electromagnetic wave and the incident electromagnetic wave, while $S_{21}$ is the ratio of the reflection electromagnetic wave and the incident electromagnetic wave. The spurious modes in FIG. 9G are the spurious modes appeared between the lowest point of $S_{11}$ and the lowest point of $S_{21}$. These spurious modes will seriously affect the filter characteristic of the bulk acoustic wave resonator 14.

FIG. 9H shows the top view of another bulk acoustic wave resonator of conventional technology and demonstrates the schematic diagram of the lateral wave. The contour 15 of the bulk acoustic wave resonator is a convex quadrilateral. Thereby the required distance for the lateral wave within the contour 15 to reach the lateral wave resonance effect has been lengthened. Hence, the energy of the lateral wave resonance effect will be reduced, or the frequency of the lateral wave resonance will depart from the frequency of the vertical wave resonance. However conventional technology did not disclose the technical solution of a bulk acoustic wave resonator having a contour formed by at least three curved edges.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

The main technical problem that the present invention is seeking to solve is how to effectively remove the spurious mode in order to reduce the impact of the spurious mode on the filter characteristic of the bulk acoustic wave resonator.

In order to solve the problems mentioned the above and to achieve the expected effect, the present invention provides a resonance structure of bulk acoustic wave resonator comprising a bottom electrode, a dielectric layer and a top electrode. The dielectric layer formed on the bottom electrode. The top electrode formed on the dielectric layer. A resonance area is defined by the overlapping area of the projection of the bottom electrode, the dielectric layer and the top electrode. The resonance area has a contour. The contour includes at least three curved edges and is formed by connecting the at least three curved edges, wherein each curved edge is concave to a geometric center of the contour. Instead of the straight line edges of the convex quadrilateral of conventional technology, the contour of the resonance structure of the bulk acoustic wave resonator of the present invention is formed by the curved edges. Thereby the resonant path of the lateral wave is lengthened such that the energy of the spurious mode is reduced in order to suppress the spurious mode close to the frequency of the vertical wave resonance, and/or the frequency of the lateral wave resonance is departing from the frequency of the vertical wave resonance. Therefore the impact of the spurious mode on the filter characteristic of the bulk acoustic wave resonator is reduced.

In an embodiment, the at least three curved edges include at least one selected from the group consisting of an elliptical arc, a circular arc, a parabolic arc, a hyperbolic arc and a cycloidal arc.

In an embodiment, the at least three curved edges include even number of curved edges, a chord having a chord length a is formed by connecting two endpoints of each curved edge, a sagitta d is defined as the maximum distance between each curved edge and its corresponding chord, wherein:

$$\left(\frac{\sqrt{2}-1}{2}\right)a < d \le \frac{a}{2}.$$

In an embodiment, the at least three curved edges include odd number of curved edges, a chord having a chord length a is formed by connecting two endpoints of each curved edge, a sagitta d is defined as the maximum distance between each curved edge and its corresponding chord, wherein:

$$\frac{a}{13} < d \le \frac{a}{2}.$$

In an embodiment, the at least three curved edges include at least one circular arc, a chord is formed by connecting two endpoints of each curved edge, a center of each circular arc is located on a perpendicular bisector of the corresponding chord.

In an embodiment, each circular arc is a minor arc or a semi-circle.

In an embodiment, each circular arc has the same arc length.

In an embodiment, each curved edge is a circular arc.

In an embodiment, a chord is formed by connecting two endpoints of each curved edge, a convex polygon is formed by connecting all chords.

In an embodiment, the at least three curved edges include three curved edges, the convex polygon is a triangle, each interior angle of the convex polygon is greater than or equal to 45° and less than or equal to 90°.

In an embodiment, the at least three curved edges include four curved edges, the convex polygon is a convex quadrilateral, each interior angle of the convex polygon is greater than or equal to 60° and less than or equal to 135°.

In an embodiment, the at least three curved edges include five curved edges, the convex polygon is a convex pentagon, each interior angle of the convex polygon is greater than or equal to 65° and less than or equal to 170°.

In an embodiment, a chord is formed by connecting two endpoints of each curved edge, at least one of the curved edges is symmetric with respect to a perpendicular bisector of the corresponding chord.

In an embodiment, a chord is formed by connecting two endpoints of each curved edge, each curved edge is symmetric with respect to a perpendicular bisector of the corresponding chord.

In an embodiment, a chord is formed by connecting two endpoints of each curved edge, each curved edge is located within the range between two perpendicular lines perpendicular to the corresponding chord and passing through two endpoints of the corresponding chord respectively.

In an embodiment, each curved edge has the same curved edge length.

The present invention further provides a resonance structure of bulk acoustic wave resonator comprising a bottom electrode, a dielectric layer and a top electrode. The dielectric layer formed on the bottom electrode. The top electrode formed on the dielectric layer. A resonance area is defined by the overlapping area of the projection of the bottom electrode, the dielectric layer and the top electrode. The resonance area has a contour. The contour includes at least three curved edges and at least one linking curved edge and is formed by connecting the at least three curved edges and the at least one linking curved edge, wherein each curved edge is concave to a geometric center of the contour, each linking curved edge is convex to the geometric center, wherein a number of the at least three curved edges is greater than or equal to a number of the at least one linking curved edge, two endpoints of each linking curved edge are connected with two curved edges respectively. Instead of the straight line edges of the convex quadrilateral of conventional technology, the contour of the resonance structure of the bulk acoustic wave resonator of the present invention is formed by the curved edges, and furthermore by using the linking curved edge to remove the singular point of the contour to form a smooth curve contour. Thereby the resonant path of the lateral wave is further lengthened such that the energy of the spurious mode is reduced in order to suppress the spurious mode close to the frequency of the vertical wave resonance, and/or the frequency of the lateral wave resonance is departing from the frequency of the vertical wave resonance. Therefore the impact of the spurious mode on the filter characteristic of the bulk acoustic wave resonator is reduced.

In an embodiment, the contour formed by connecting the at least three curved edges and the at least one linking curved edge is a smooth curve without the presence of a singular point.

In an embodiment, the number of the at least three curved edges is equal to the number of the at least one linking curved edge, two endpoints of each curved edge are connected with two linking curved edges respectively.

In an embodiment, a ratio of a length of each linking curved edge and a length of any one of the two curved edges adjacent to the linking curved edge is between 1:5 and 1:50.

In an embodiment, the at least three curved edges include at least one selected from the group consisting of an elliptical arc, a circular arc, a parabolic arc, a hyperbolic arc and a cycloidal arc.

In an embodiment, the at least three curved edges include even number of curved edges, a chord having a chord length a is formed by connecting two endpoints of each curved edge, a sagitta d is defined as the maximum distance between each curved edge and its corresponding chord, wherein:

$$\left(\frac{\sqrt{2}-1}{2}\right)a < d \le \frac{a}{2}.$$

In an embodiment, the at least three curved edges include odd number of curved edges, a chord having a chord length a is formed by connecting two endpoints of each curved edge, a sagitta d is defined as the maximum distance between each curved edge and its corresponding chord, wherein:

$$\frac{a}{13} < d \le \frac{a}{2}.$$

In an embodiment, the at least three curved edges include at least one circular arc, a chord is formed by connecting two endpoints of each curved edge, a center of each circular arc is located on a perpendicular bisector of the corresponding chord.

In an embodiment, each circular arc is a minor arc or a semi-circle.

In an embodiment, each circular arc has the same arc length.

In an embodiment, each curved edge is a circular arc.

In an embodiment, a chord is formed by connecting two endpoints of each curved edge, a convex polygon is formed by extending all chords and connecting all the extended chords, wherein the number of the at least three curved edges is equal to a number of the sides of the convex polygon.

In an embodiment, the at least three curved edges include three curved edges, the convex polygon is a triangle, each interior angle of the convex polygon is greater than or equal to 45° and less than or equal to 90°.

In an embodiment, the at least three curved edges include four curved edges, the convex polygon is a convex quadrilateral, each interior angle of the convex polygon is greater than or equal to 60° and less than or equal to 135°.

In an embodiment, the at least three curved edges include five curved edges, the convex polygon is a convex pentagon, each interior angle of the convex polygon is greater than or equal to 65° and less than or equal to 170°.

In an embodiment, a chord is formed by connecting two endpoints of each curved edge, at least one of the curved edges is symmetric with respect to a perpendicular bisector of the corresponding chord.

In an embodiment, a chord is formed by connecting two endpoints of each curved edge, each curved edge is symmetric with respect to a perpendicular bisector of the corresponding chord.

In an embodiment, a chord is formed by connecting two endpoints of each curved edge, each curved edge is located within the range between two perpendicular lines perpendicular to the corresponding chord and passing through two endpoints of the corresponding chord respectively.

In an embodiment, each curved edge has the same curved edge length.

In an embodiment, each linking curved edge has the same linking curved edge length.

For further understanding the characteristics and effects of the present invention, some preferred embodiments referred to drawings are in detail described as follows.

DETAILED DESCRIPTIONS OF PREFERRED EMBODIMENTS

Figure 1A:
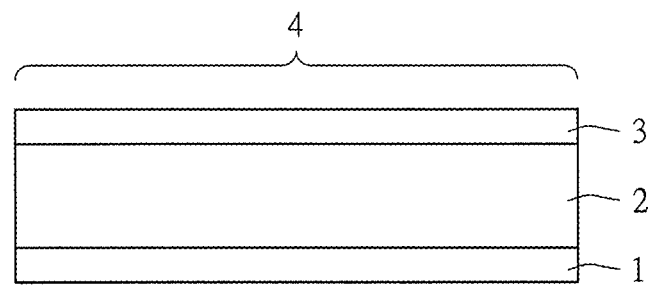
FIG. 1A is a sectional schematic view of an embodiment of a resonance structure of bulk acoustic wave resonator of the present invention.
Figure 1B:
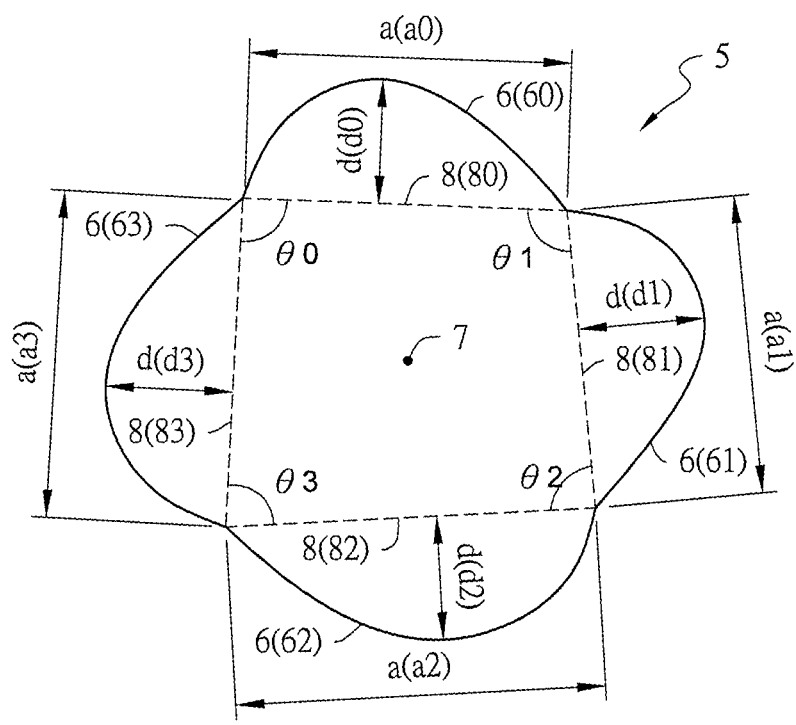
FIG. 1B is a top view of an embodiment having four curved edges of a resonance structure of bulk acoustic wave resonator of the present invention.
Figure 1C:
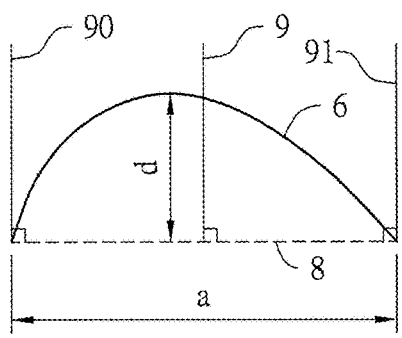
FIG. 1C is an exploded view of the curved edge of FIG. 1B.

Please refer to FIG. 1A and FIG. 1B, which are respectively a sectional schematic view and a top view of an embodiment having four curved edges of a resonance structure of bulk acoustic wave resonator of the present invention. FIG. 1A shows that the structure of the embodiment comprises a bottom electrode 1, a dielectric layer 2 and a top electrode 3. The dielectric layer 2 is formed on the bottom electrode 1. The top electrode 3 is formed on the dielectric layer 2. A resonance area 4 is defined by the overlapping area of the projection of the bottom electrode 1, the dielectric layer 2 and the top electrode 3. FIG. 1B shows that the resonance area 4 of the embodiment has a contour 5. The contour 5 includes four curved edges 6 (curved edge 60, curved edge 61, curved edge 62 and curved edge 63). Each of curved edges 6 (curved edge 60, curved edge 61, curved edge 62 and curved edge 63) is concave to a geometric center 7 of the contour 5. Please also refer to FIG. 1C, which is an exploded view of the curved edge of FIG. 1B. A chord 8 is formed by connecting two endpoints of each curved edge 6 (that is: a chord 80 is formed by connecting two endpoints of curved edge 60; a chord 81 is formed by connecting two endpoints of curved edge 61; a chord 82 is formed by connecting two endpoints of curved edge 62; and a chord 83 is formed by connecting two endpoints of curved edge 63). Each chord 8 has a chord length a (that is: the chord 80 has a chord length a0; the chord 81 has a chord length a1; the chord 82 has a chord length a2; and the chord 83 has a chord length a3). A sagitta d is defined as the maximum distance between each curved edge 6 and its corresponding chord 8 (that is: the curved edge 60 and the chord 80 has a maximum distance sagitta d0; the curved edge 61 and the chord 81 has a maximum distance sagitta d1; the curved edge 62 and the chord 82 has a maximum distance sagitta d2; and the curved edge 63 and the chord 83 has a maximum distance sagitta d3). A convex quadrilateral is formed by connecting four chords 8 (the chord 80, the chord 81, the chord 82 and the chord 83). An angle θ is defined between each chord 8 and its adjacent chord (that is: an angle $\theta_0$ is defined between the chord 83 and the chord 80; an angle $\theta_1$ is defined between the chord 80 and the chord 81; an angle $\theta_2$ is defined between the chord 81 and the chord 82; and an angle $\theta_3$ is defined between the chord 82 and the chord 83). Four angles θ ($\theta_0$, $\theta_1$, $\theta_2$ and $\theta_3$) are respectively four interior angles of the convex quadrilateral. As shown in FIG. 1C, each chord 8 has a perpendicular bisector 9. A perpendicular line 90 and a perpendicular line 91 are perpendicular to the chord 8 and pass through two endpoints of the curved edge 6 respectively. Assume the chord 8 is an X-axis and the perpendicular bisector 9 is a Y-axis, then the curved edge 6 would be a concave downward function and the curved edge 6 would be within the range between the perpendicular line 90 and the perpendicular line 91. As shown in FIG. 1C, the curved edge 6 is asymmetric with respect to the perpendicular bisector 9 of the chord 8. Each of curved edges 6 (curved edge 60, curved edge 61, curved edge 62 and curved edge 63) may be an elliptical arc, a circular arc, a parabolic arc, a hyperbolic arc or a cycloidal arc. It also may be an arc of other function. In the embodiment of FIG. 1B, four curved edges 6 (curved edge 60, curved edge 61, curved edge 62 and curved edge 63) are four non-identical curved edges. Four curved edges 6 are four different kinds of arcs respectively. And four curved edges 6 have different curved edge lengths respectively. The four chords 8 corresponding to four curved edges 6 have different chord lengths a respectively. Four curved edges 6 and their corresponding chords 8 have different maximum distance sagittas d respectively. Four curved edges 6 are respectively asymmetric with respect to the perpendicular bisectors 9 of their corresponding chords 8. The convex quadrilateral formed by connecting four chords 8 has four different interior angles θ. Instead of the straight line edges of the convex quadrilateral, the contour of the resonance structure of the bulk acoustic wave resonator of the present invention is formed by the curved edges. Thereby the resonant path of the lateral wave is lengthened such that the energy of the spurious mode is reduced in order to suppress the spurious mode close to the frequency of the vertical wave resonance, and/or the frequency of the lateral wave resonance is departing from the frequency of the vertical wave resonance. Therefore the impact of the spurious mode on the filter characteristic of the bulk acoustic wave resonator is reduced. In an embodiment, each interior angle of the convex quadrilateral is greater than or equal to 60° and less than or equal 135°. In a preferable embodiment, the relation between the sagitta d and the chord length a is:

$$\left(\frac{\sqrt{2}-1}{2}\right)a < d \leq \frac{a}{2},$$

thereby the impact of the spurious mode on the filter characteristic of bulk acoustic wave resonator is reduced.

Figure 1D:
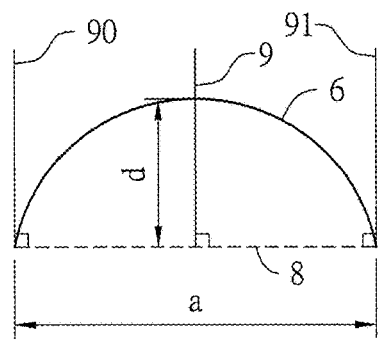
FIG. 1D is an embodiment of a symmetric curved edge of a resonance structure of bulk acoustic wave resonator of the present invention.

In all the embodiments of the present invention, the number of the curved edges 6 is greater than or equal to 3. In an embodiment, the main structure is mostly similar to the structure of the embodiment shown in FIG. 1B, except that part of the four curved edges 6 are the same kind of arc (For example: the curved edge 60 is an elliptical arc, the curved edge 61 is a parabolic arc, and the curved edge 62 and the curved edge 63 are circular arc). In another embodiment, the main structure is mostly similar to the structure of the embodiment shown in FIG. 1B, except that all the four curved edges 6 are the same kind of arc (For example: the curved edge 60, the curved edge 61, the curved edge 62 and the curved edge 63 are all circular arc). In an embodiment, the main structure is mostly similar to the structure of the embodiment shown in FIG. 1B, except that part of the four curved edges 6 have the same curved edge length. In another embodiment, the main structure is mostly similar to the structure of the embodiment shown in FIG. 1B, except that all the four curved edges 6 have the same curved edge length. In an embodiment, the main structure is mostly similar to the structure of the embodiment shown in FIG. 1B, except that part of the four chords 8 have the same chord length a. In another embodiment, the main structure is mostly similar to the structure of the embodiment shown in FIG. 1B, except that all the chords 8 have the same chord length a. In an embodiment, the main structure is mostly similar to the structure of the embodiment shown in FIG. 1B, except that part of the four curved edges 6 and their corresponding chords 8 have the same maximum distance sagitta d. In another embodiment, the main structure is mostly similar to the structure of the embodiment shown in FIG. 1B, except that all the four curved edges 6 and their corresponding chords 8 have the same maximum distance sagitta d. Please also refer to FIG. 1D, which is an embodiment of a symmetric curved edge of a resonance structure of bulk acoustic wave resonator of the present invention. The main structure of the embodiment is mostly similar to the structure of the embodiment shown in FIG. 1C, except that the curved edge 6 is symmetric with respect to the perpendicular bisector 9 of the chord 8. In an embodiment, the main structure is mostly similar to the structure of the embodiment shown in FIG. 1B, except that part of the four curved edges 6 are symmetric with respect to the perpendicular bisectors 9 of the corresponding chords 8. In another embodiment, the main structure is mostly similar to the structure of the embodiment shown in FIG. 1B, except that all the four curved edges 6 are symmetric with respect to the perpendicular bisectors 9 of the corresponding chords 8. In an embodiment, the main structure is mostly similar to the structure of the embodiment shown in FIG. 1B, except that part of the interior angles θ of the convex quadrilateral which is formed by the four chords 8 are the same. In another embodiment, the main structure is mostly similar to the structure of the embodiment shown in FIG. 1B, except that all the interior angles θ of the convex quadrilateral which is formed by the four chords 8 are the same.

Figure 1E:
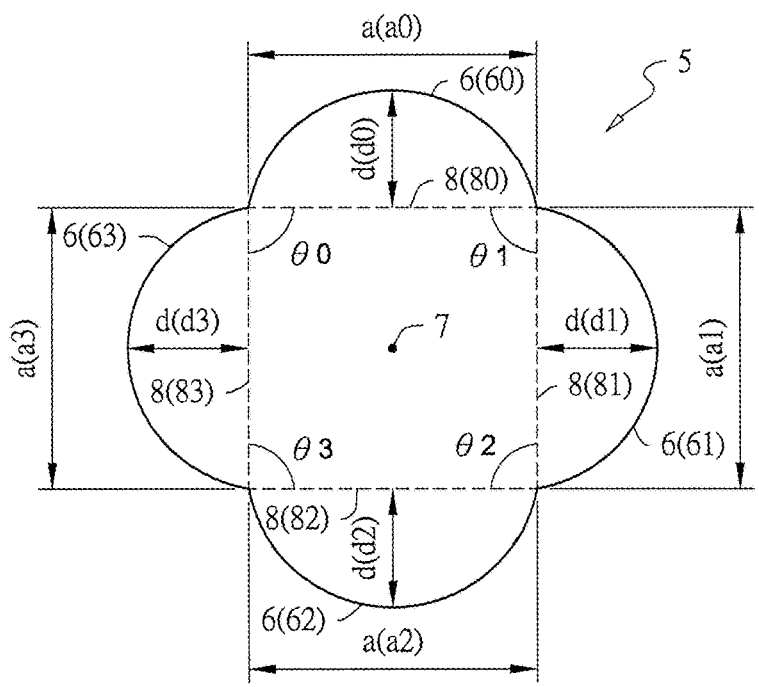
FIG. 1E is a top view of another embodiment having four curved edges of a resonance structure of bulk acoustic wave resonator of the present invention.

Please refer to FIG. 1E, which is a top view of another embodiment having four curved edges of a resonance structure of bulk acoustic wave resonator of the present invention. The main structure of the embodiment is mostly similar to the structure of the embodiment shown in FIG. 1B, except that four curved edges 6 (curved edge 60, curved edge 61, curved edge 62 and curved edge 63) are four identical curved edges. Four curved edges 6 are all circular arc. The circular arc may be a minor arc or a semi-circle. A center (not shown in Figure) of the circular arc is located on a perpendicular bisector 9 of the corresponding chord 8. And all the four curved edges 6 have the same curved edge length. All the four chords 8 corresponding to four curved edges 6 have the same chord lengths a. All the four curved edges 6 and their corresponding chords 8 have the same maximum distance sagittas d. All the four curved edges 6 are symmetric with respect to the perpendicular bisectors 9 of the corresponding chords 8. All the interior angles θ of the convex quadrilateral which is formed by the four chords 8 are the same (that is: $\theta_0 = \theta_1 = \theta_2 = \theta_3 = 90°$).

Figure 1F:
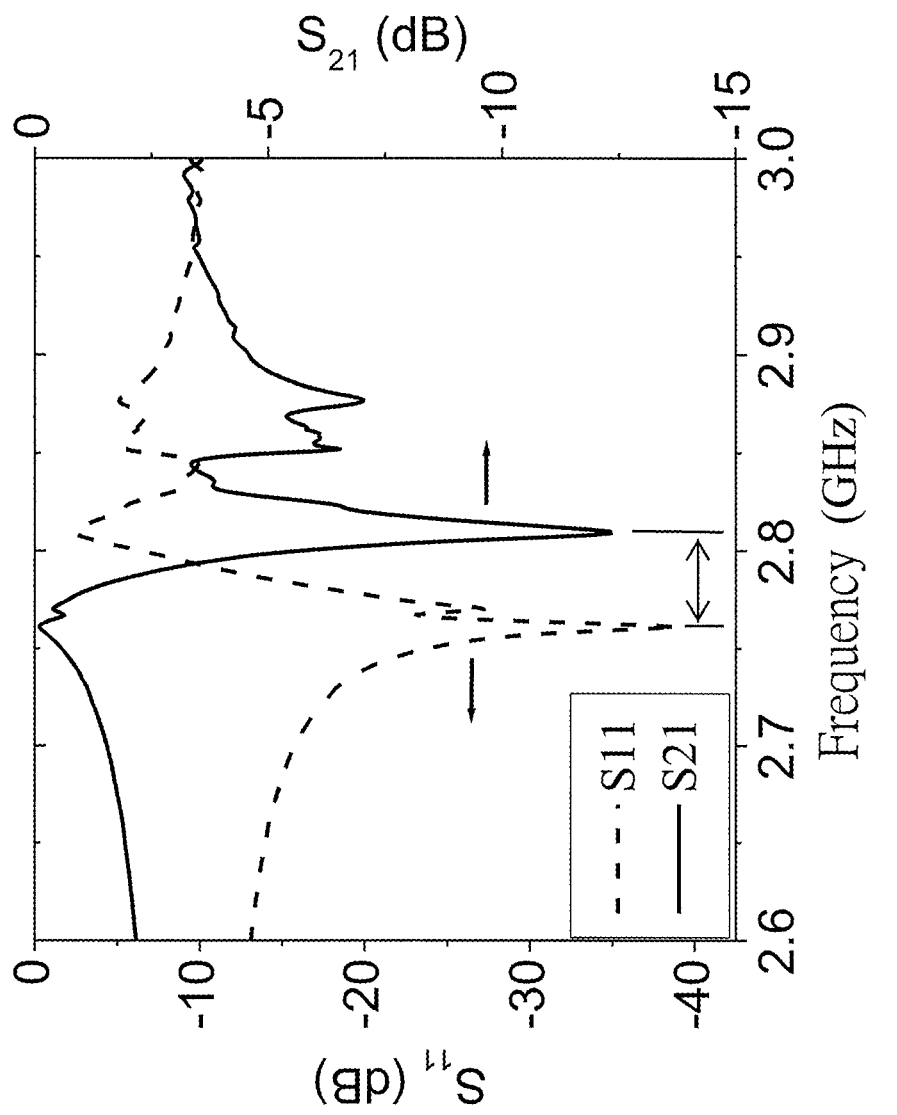
FIG. 1F is the frequency response graph of an embodiment having four curved edges of a resonance structure of bulk acoustic wave resonator of the present invention as shown in FIG. 1E.

Please refer to FIG. 1F, which is the frequency response graph of an embodiment having four curved edges of a resonance structure of bulk acoustic wave resonator of the present invention as shown in FIG. 1E. The four curved edges 6 are all semi-circle. And the relation between the sagitta d and the chord length a is:

$$d = \frac{a}{2}.$$

Figure 1G:
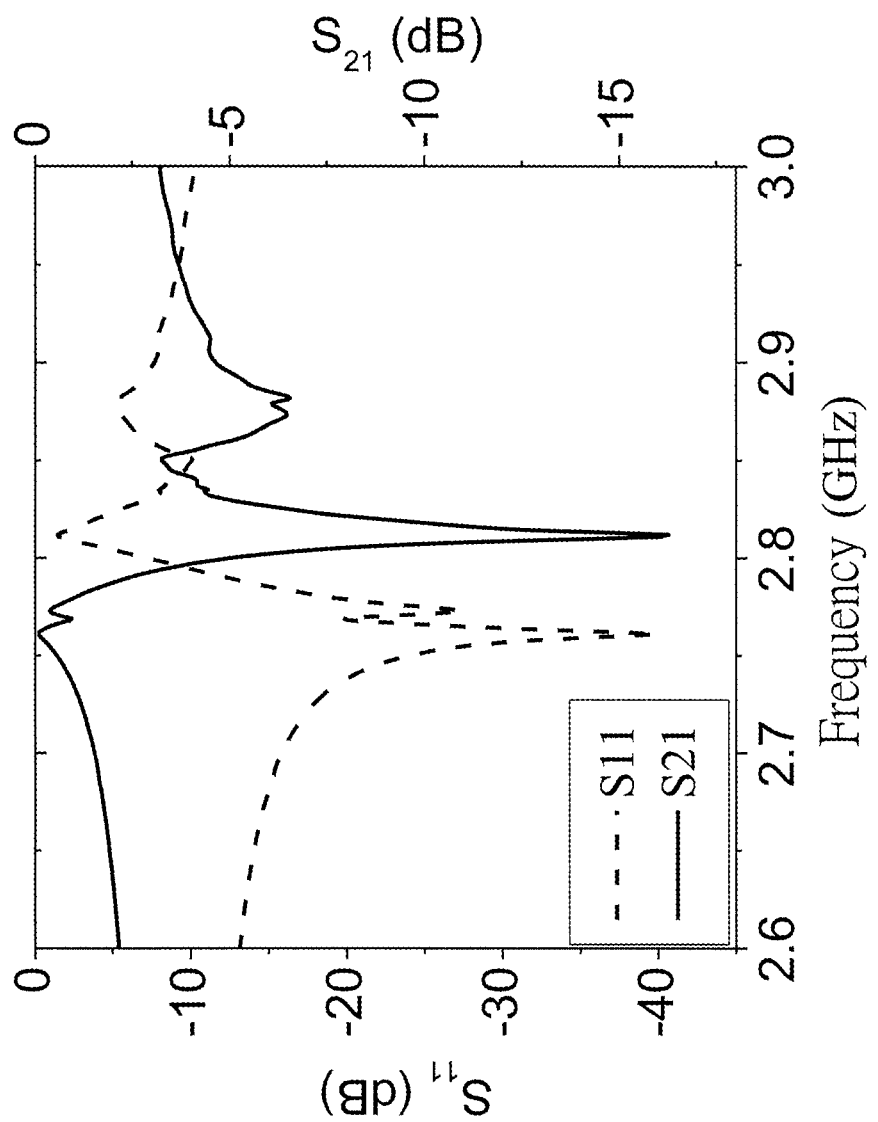
FIG. 1G is the frequency response graph of another embodiment having four curved edges of a resonance structure of bulk acoustic wave resonator of the present invention as shown in FIG. 1E.
Figure 9A:
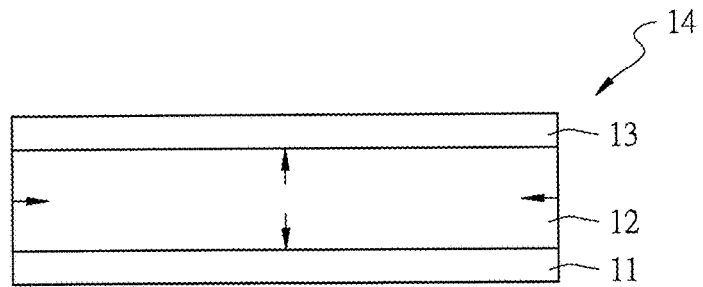
FIG. 9A and FIG. 9B are the sectional schematic views of the bulk acoustic wave resonator of conventional technology and demonstrate the schematic diagrams of the vibration of the piezoelectric material in the vertical direction inducing the vibration in the horizontal direction.
Figure 9B:
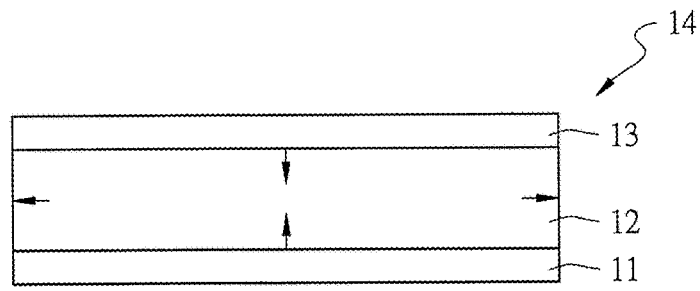
Figure 9C:
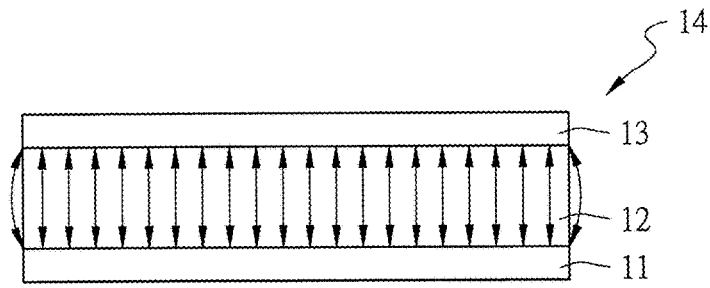
FIG. 9C is the sectional schematic view of the bulk acoustic wave resonator of conventional technology and demonstrates the schematic diagram of the electric field applied between the top electrode and the bottom electrode.
Figure 9D:
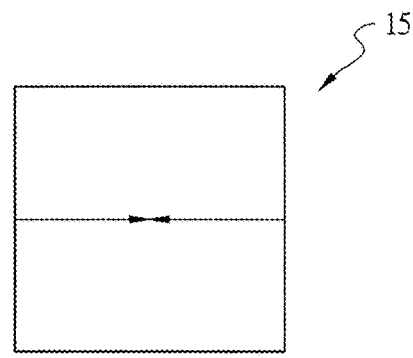
FIG. 9D, FIG. 9E and FIG. 9F are the top views of the bulk acoustic wave resonator of conventional technology and demonstrate the schematic diagrams of three types of resonance states of the lateral wave respectively.
Figure 9E:
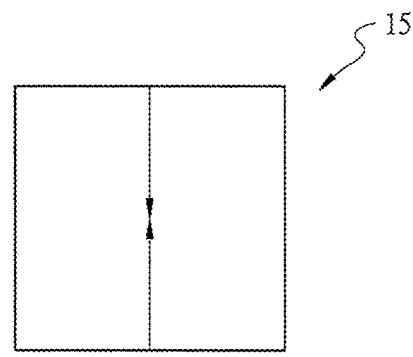
Figure 9F:
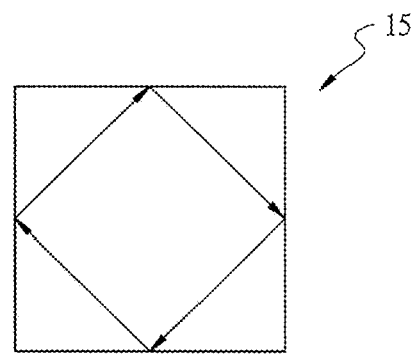
Figure 9G:
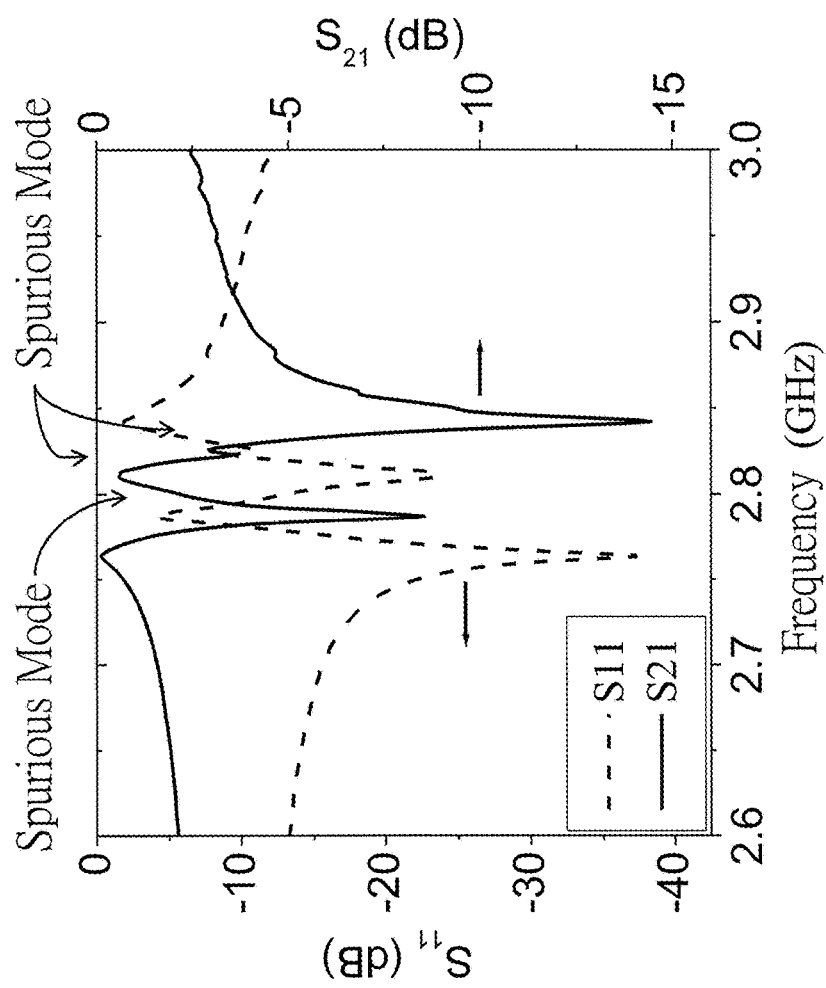
FIG. 9G is the frequency response graph of the bulk acoustic wave resonator of conventional technology.
Figure 9H:
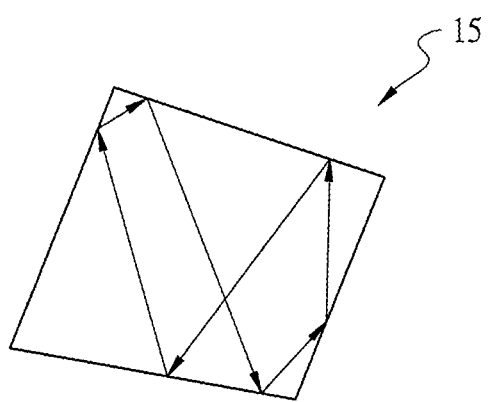
FIG. 9H the top view of another bulk acoustic wave resonator of conventional technology and demonstrates the schematic diagram of the lateral wave.

$S_{11}$ is the ratio of the transmission electromagnetic wave and the incident electromagnetic wave, while $S_{21}$ is the ratio of the reflection electromagnetic wave and the incident electromagnetic wave. Compare to FIG. 9G which is the frequency response graph of the bulk acoustic wave resonator of conventional technology, in FIG. 1F the spurious modes appeared between the lowest point of $S_{11}$ and the lowest point of $S_{21}$ is significantly suppressed, or the frequency of the spurious modes depart from the range between the lowest point of $S_{11}$ and the lowest point of $S_{21}$. Please refer to FIG. 1G, which is the frequency response graph of another embodiment having four curved edges of a resonance structure of bulk acoustic wave resonator of the present invention as shown in FIG. 1E. The four curved edges 6 are all minor arc. And the relation between the sagitta d and the chord length a is:

$$\left(\frac{\sqrt{5}-1}{4}\right)a = d.$$

$S_{11}$ is the ratio of the transmission electromagnetic wave and the incident electromagnetic wave, while $S_{21}$ is the ratio of the reflection electromagnetic wave and the incident electromagnetic wave. Compare to FIG. 9G which is the frequency response graph of the bulk acoustic wave resonator of conventional technology, in FIG. 1G the spurious modes appeared between the lowest point of $S_{11}$ and the lowest point of $S_{21}$ is significantly suppressed, or the frequency of the spurious modes depart from the range between the lowest point of $S_{11}$ and the lowest point of $S_{21}$. In a preferable embodiment, the four curved edges 6 are all minor arc or semi-circle. And the relation between the sagitta d and the chord length a is:

$$\left(\frac{\sqrt{2}-1}{2}\right)a < d \le \frac{a}{2},$$

thereby the impact of the spurious mode on the filter characteristic of bulk acoustic wave resonator is reduced.

Figure 1H:
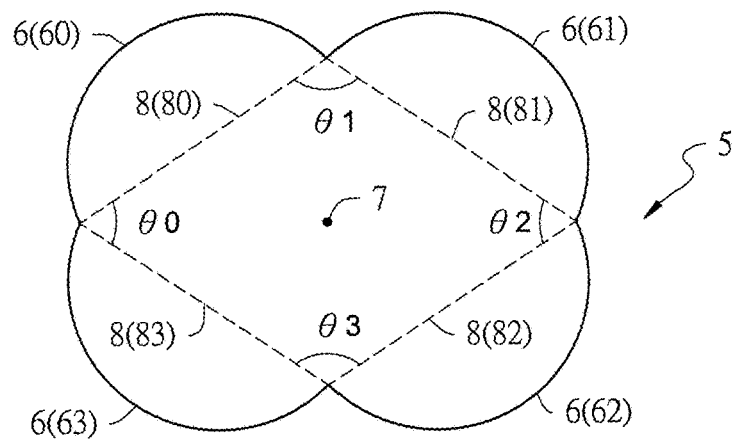
FIG. 1H is a top view of another embodiment having four curved edges of a resonance structure of bulk acoustic wave resonator of the present invention.

Please refer to FIG. 1H, which is a top view of another embodiment having four curved edges of a resonance structure of bulk acoustic wave resonator of the present invention. The main structure of the embodiment is mostly similar to the structure of the embodiment shown in FIG. 1B, except that four curved edges 6 (curved edge 60, curved edge 61, curved edge 62 and curved edge 63) are four identical curved edges. Four curved edges 6 are all circular arc. The circular arc may be a minor arc or a semi-circle. A center (not shown in Figure) of the circular arc is located on a perpendicular bisector 9 of the corresponding chord 8. And all the four curved edges 6 have the same curved edge length. All the four chords 8 corresponding to four curved edges 6 have the same chord lengths a. All the four curved edges 6 and their corresponding chords 8 have the same maximum distance sagittas d. All the four curved edges 6 are symmetric with respect to the perpendicular bisectors 9 of the corresponding chords 8. Part of the interior angles θ of the convex quadrilateral which is formed by the four chords 8 are the same (that is: $\theta_0=\theta_2<\theta_1=\theta_3$).

Figure 1I:
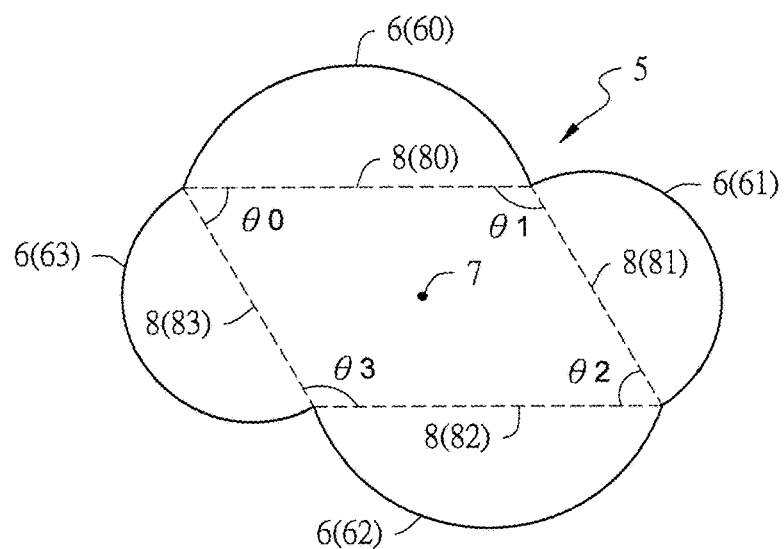
FIG. 1I is a top view of another embodiment having four curved edges of a resonance structure of bulk acoustic wave resonator of the present invention.

Pleases refer to FIG. 1I, which is a top view of another embodiment having four curved edges of a resonance structure of bulk acoustic wave resonator of the present invention. The main structure of the embodiment is mostly similar to the structure of the embodiment shown in FIG. 1B, except that part of the four curved edges 6 (curved edge 60, curved edge 61, curved edge 62 and curved edge 63) are identical curved edges, wherein curved edge 60 and curved edge 62 are identical curved edges; curved edge 61 and curved edge 63 are identical curved edges. Four curved edges 6 are all circular arc. The circular arc may be a minor arc or a semi-circle. A center (not shown in Figure) of the circular arc is located on a perpendicular bisector 9 of the corresponding chord 8. And part of the four curved edges 6 have the same curved edge length, wherein curved edge 60 and curved edge 62 have the same curved edge length; curved edge 61 and curved edge 63 have the same curved edge length. Part of the four chords 8 corresponding to four curved edges 6 have the same chord lengths a (that is: the chord length a0 of the chord 80=the chord length a2 of the chord 82>the chord length a1 of the chord 81=the chord length a3 of the chord 83). All the four curved edges 6 and their corresponding chords 8 have the same maximum distance sagittas d. All the four curved edges 6 are symmetric with respect to the perpendicular bisectors 9 of the corresponding chords 8. Part of the interior angles θ of the convex quadrilateral which is formed by the four chords 8 are the same (that is: $\theta_0=\theta_2<\theta_1=\theta_3$).

Figure 2A:
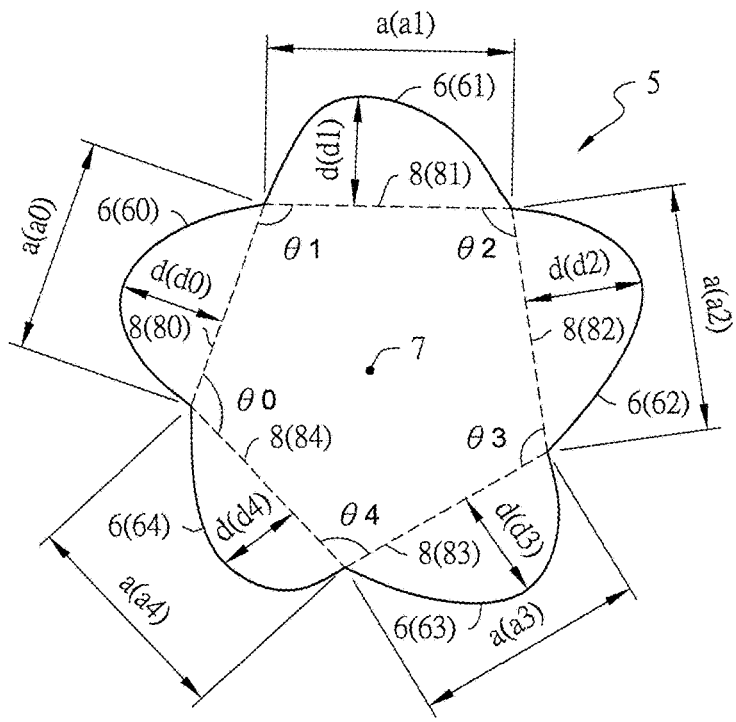
FIG. 2A is a top view of an embodiment having five curved edges of a resonance structure of bulk acoustic wave resonator of the present invention.

Please refer to FIG. 2A, which is a top view of an embodiment having five curved edges of a resonance structure of bulk acoustic wave resonator of the present invention. The main structure of the embodiment is mostly similar to the structure of the embodiment shown in FIG. 1B, except that the contour 5 includes five curved edges 6 (curved edge 60, curved edge 61, curved edge 62, curved edge 63 and curved edge 64). Each of curved edges 6 (curved edge 60, curved edge 61, curved edge 62, curved edge 63 and curved edge 64) is concave to a geometric center 7 of the contour 5. A chord 8 is formed by connecting two endpoints of each curved edge 6 (that is: a chord 80 is formed by connecting two endpoints of curved edge 60; a chord 81 is formed by connecting two endpoints of curved edge 61; a chord 82 is formed by connecting two endpoints of curved edge 62; a chord 83 is formed by connecting two endpoints of curved edge 63; and a chord 84 is formed by connecting two endpoints of curved edge 64). Each chord 8 has a chord length a (that is: the chord 80 has a chord length a0; the chord 81 has a chord length a1; the chord 82 has a chord length a2; the chord 83 has a chord length a3; and the chord 84 has a chord length a4). A sagitta d is defined as the maximum distance between each curved edge 6 and its corresponding chord 8 (that is: the curved edge 60 and the chord 80 has a maximum distance sagitta d0; the curved edge 61 and the chord 81 has a maximum distance sagitta d1; the curved edge 62 and the chord 82 has a maximum distance sagitta d2; the curved edge 63 and the chord 83 has a maximum distance sagitta d3; and the curved edge 64 and the chord 84 has a maximum distance sagitta d4). A convex pentagon is formed by connecting five chords 8 (chord 80, chord 81, chord 82, chord 83 and chord 84). An angle θ is defined between each chord 8 and its adjacent chord (that is: an angle $\theta_0$ is defined between the chord 84 and the chord 80; an angle $\theta_1$ is defined between the chord 80 and the chord 81; an angle $\theta_2$ is defined between the chord 81 and the chord 82; an angle $\theta_3$ is defined between the chord 82 and the chord 83; and an angle $\theta_4$ is defined between the chord 83 and the chord 84). Five angles θ ($\theta_0$, $\theta_1$, $\theta_2$, $\theta_3$ and $\theta_4$) are respectively five interior angles of the convex pentagon. Each chord 8 has a perpendicular bisector 9 (as shown in FIG. 1C). Each of curved edges 6 (curved edge 60, curved edge 61, curved edge 62, curved edge 63 and curved edge 64) may be an elliptical arc, a circular arc, a parabolic arc, a hyperbolic arc or a cycloidal arc. It also may be an arc of other function. In the embodiment of FIG. 2A, five curved edges 6 (curved edge 60, curved edge 61, curved edge 62, curved edge 63 and curved edge 64) are five non-identical curved edges. Five curved edges 6 are five different kinds of arcs respectively. And five curved edges 6 have different curved edge lengths respectively. The five chords 8 corresponding to five curved edges 6 have different chord lengths a respectively. Five curved edges 6 and their corresponding chords 8 have different maximum distance sagittas d respectively. Five curved edges 6 are respectively asymmetric with respect to the perpendicular bisectors 9 of their corresponding chords 8. The convex pentagon formed by connecting five chords 8 has five different interior angles θ. In an embodiment, each interior angle of the convex pentagon is greater than or equal to 65° and less than or equal 170°. In a preferable embodiment, the relation between the sagitta d and the chord length a is:

$$\frac{a}{13} < d \le \frac{a}{2},$$

thereby the impact of the spurious mode on the filter characteristic of bulk acoustic wave resonator is reduced.

Figure 2B:
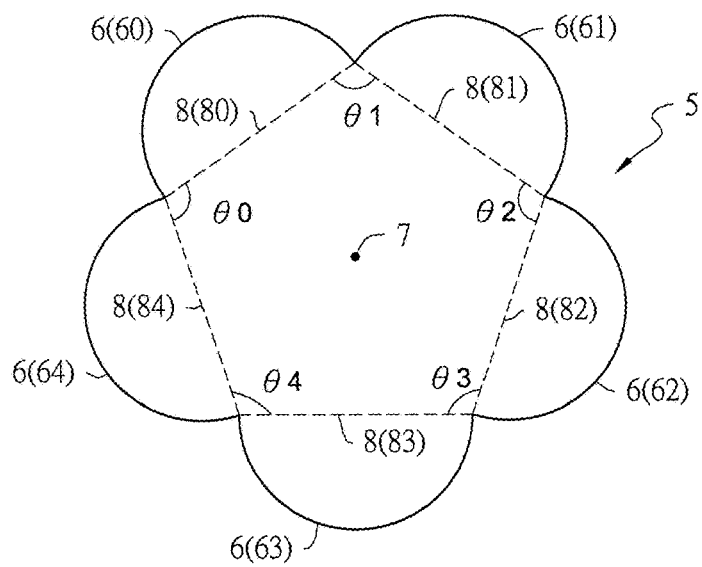
FIG. 2B is a top view of another embodiment having five curved edges of a resonance structure of bulk acoustic wave resonator of the present invention.

Please refer to FIG. 2B, which is a top view of another embodiment having five curved edges of a resonance structure of bulk acoustic wave resonator of the present invention. The main structure of the embodiment is mostly similar to the structure of the embodiment shown in FIG. 2A, except that five curved edges 6 (curved edge 60, curved edge 61, curved edge 62, curved edge 63 and curved edge 64) are five identical curved edges. Five curved edges 6 are all circular arc. The circular arc may be a minor arc or a semi-circle. A center (not shown in Figure) of the circular arc is located on a perpendicular bisector 9 of the corresponding chord 8. And all the five curved edges 6 have the same curved edge length. All the five chords 8 corresponding to five curved edges 6 have the same chord lengths a. All the five curved edges 6 and their corresponding chords 8 have the same maximum distance sagittas d. All the five curved edges 6 are symmetric with respect to the perpendicular bisectors 9 of the corresponding chords 8. All the interior angles θ of the convex pentagon which is formed by the five chords 8 are the same (that is: $\theta_0=\theta_1=\theta_2=\theta_3=\theta_4=108°$).

Figure 2C:
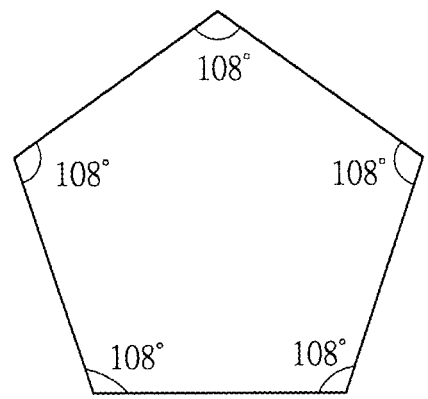
FIG. 2C is a top view of a resonance structure of bulk acoustic wave resonator having a regular pentagon contour.
Figure 2D:
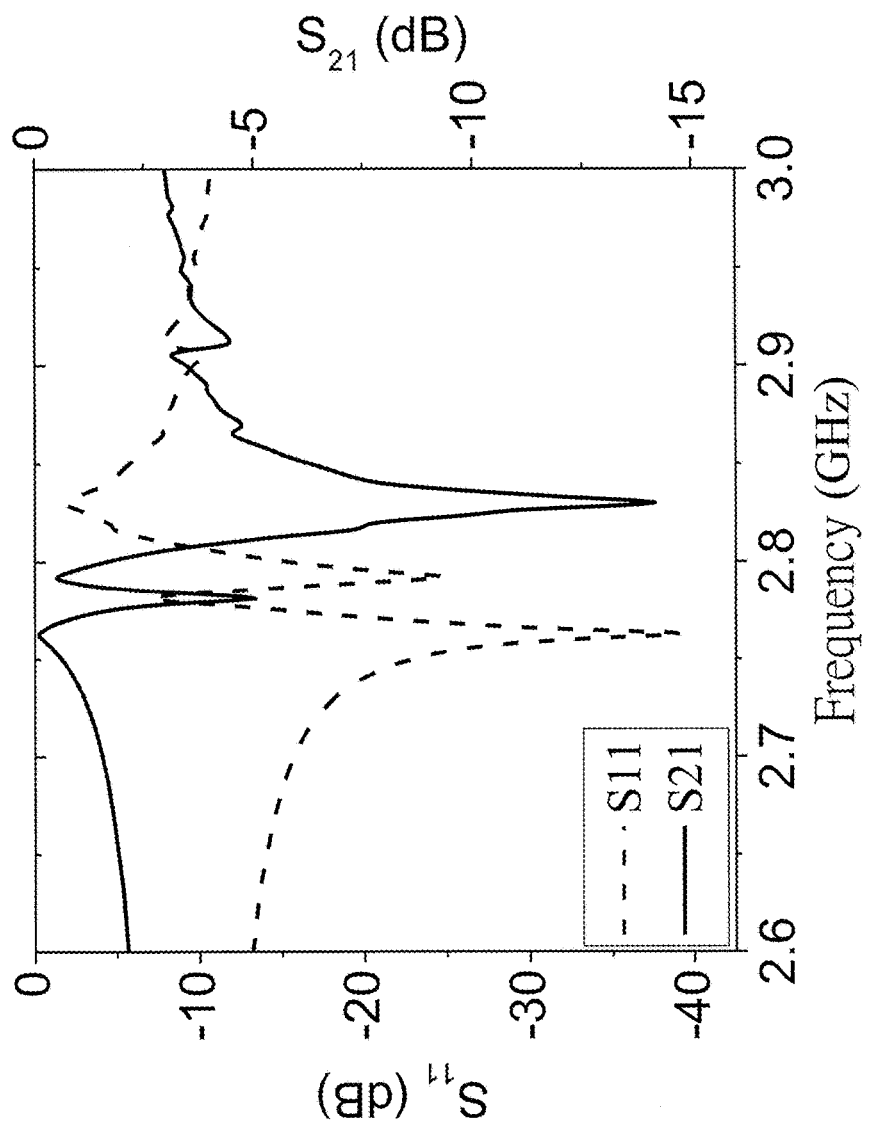
FIG. 2D is the frequency response graph of a resonance structure of bulk acoustic wave resonator having a regular pentagon contour as shown in FIG. 2C.

Please refer to FIG. 2C, which is a top view of a resonance structure of bulk acoustic wave resonator having a regular pentagon contour. Please also refer to FIG. 2D, which is the frequency response graph of a resonance structure of bulk acoustic wave resonator having a regular pentagon contour as shown in FIG. 2C. $S_{11}$ is the ratio of the transmission electromagnetic wave and the incident electromagnetic wave, while $S_{21}$ is the ratio of the reflection electromagnetic wave and the incident electromagnetic wave. In FIG. 2D, it shows that spurious modes seriously affect the filter characteristic of the bulk acoustic wave resonator.

Figure 2E:
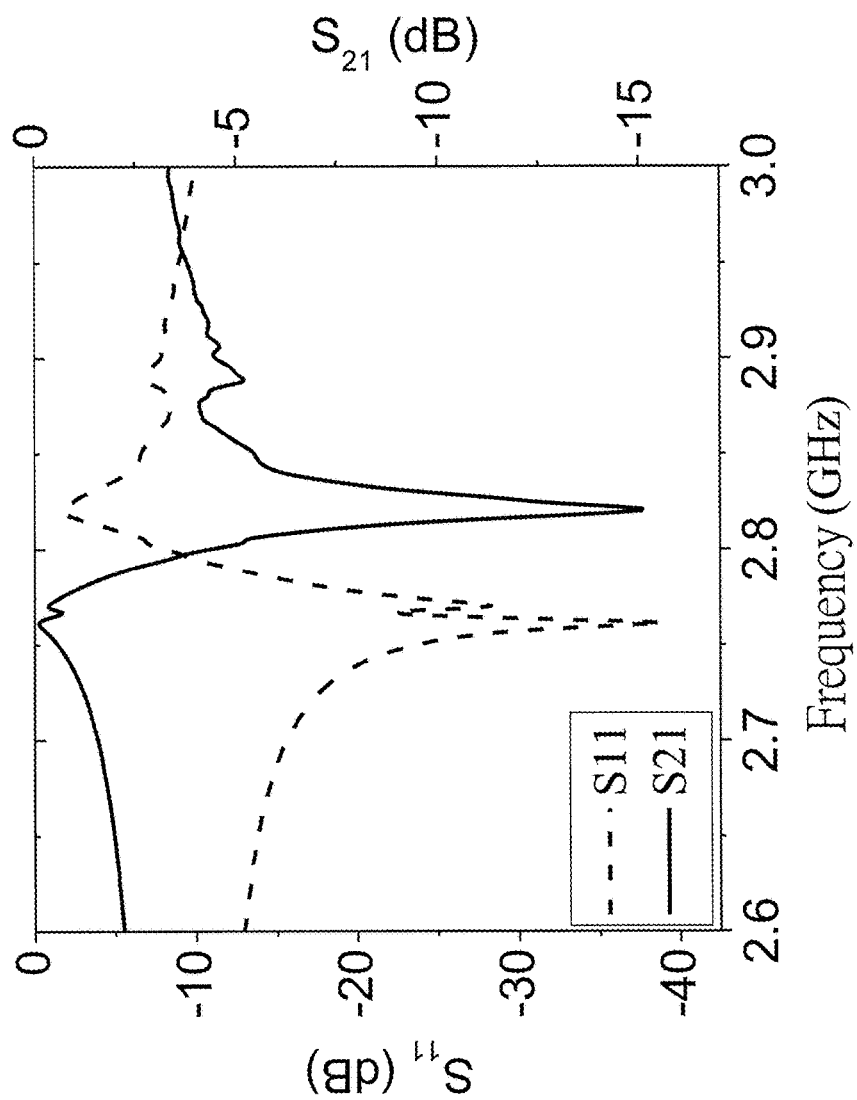
FIG. 2E is the frequency response graph of an embodiment having five curved edges of a resonance structure of bulk acoustic wave resonator of the present invention as shown in FIG. 2B.

Please refer to FIG. 2E, which is the frequency response graph of an embodiment having five curved edges of a resonance structure of bulk acoustic wave resonator of the present invention as shown in FIG. 2B. Five curved edges 6 are all semi-circle, and the relation between the sagitta d and the chord length a is:

$$d = \frac{a}{2}.$$

Figure 2F:
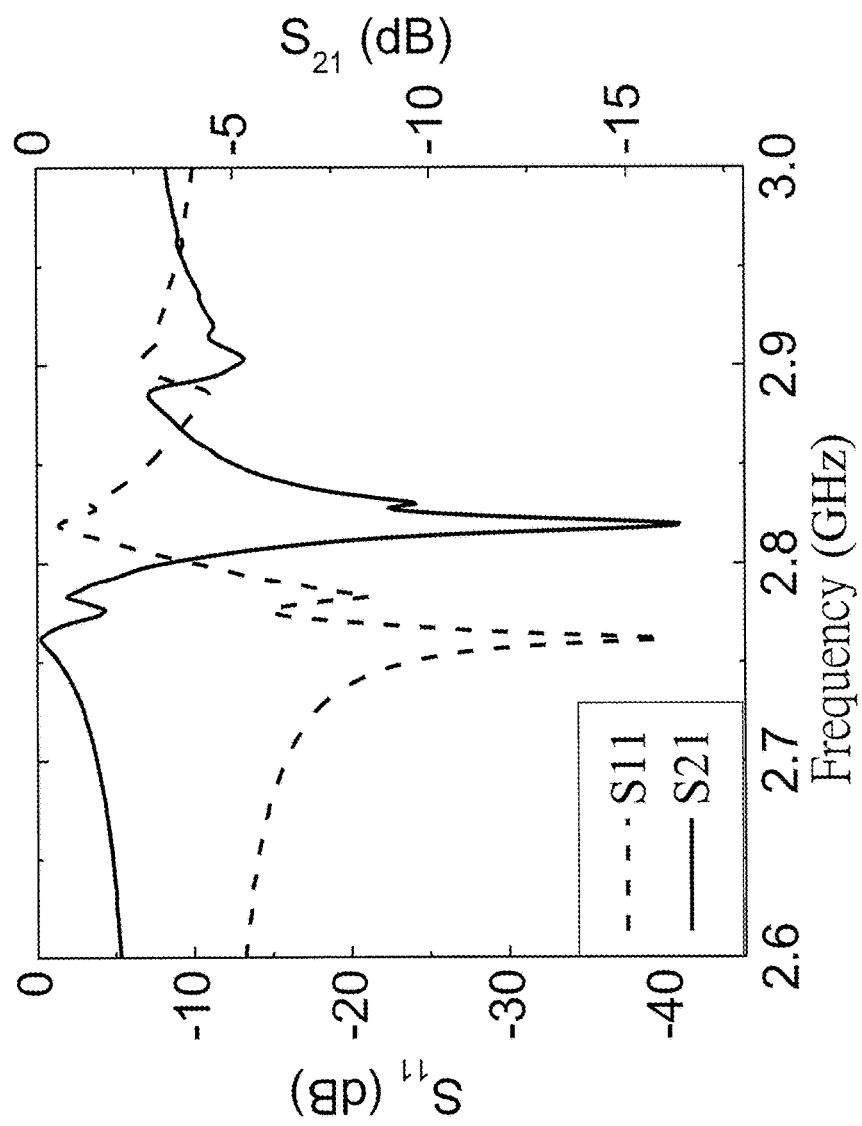
FIG. 2F is the frequency response graph of another embodiment having five curved edges of a resonance structure of bulk acoustic wave resonator of the present invention as shown in FIG. 2B.

$S_{11}$ is the ratio of the transmission electromagnetic wave and the incident electromagnetic wave, while $S_{21}$ is the ratio of the reflection electromagnetic wave and the incident electromagnetic wave. Compare to FIG. 2D which is the frequency response graph of a resonance structure of bulk acoustic wave resonator having a regular pentagon contour, in FIG. 2E the spurious modes appeared between the lowest point of $S_{11}$ and the lowest point of $S_{21}$ is significantly suppressed, or the frequency of the spurious modes depart from the range between the lowest point of $S_{11}$ and the lowest point of $S_{21}$. Please refer to FIG. 2F, which is the frequency response graph of another embodiment having five curved edges of a resonance structure of bulk acoustic wave resonator of the present invention as shown in FIG. 2B. Five curved edges 6 are all circular arc, and the relation between the sagitta d and the chord length a is:

$$d = \frac{a}{12}.$$

$S_{11}$ is the ratio of the transmission electromagnetic wave and the incident electromagnetic wave, while $S_{21}$ is the ratio of the reflection electromagnetic wave and the incident electromagnetic wave. Compare to FIG. 2D which is the frequency response graph of a resonance structure of bulk acoustic wave resonator having a regular pentagon contour, in FIG. 2E the spurious modes appeared between the lowest point of $S_{11}$ and the lowest point of $S_{21}$ is significantly suppressed, or the frequency of the spurious modes depart from the range between the lowest point of $S_{11}$ and the lowest point of $S_{21}$ (Although the spurious modes is not suppressed as effectively as the embodiment of FIG. 2E, but some spurious modes have been removed). In a preferable embodiment, the five curved edges 6 are all minor arc or semi-circle. And the relation between the sagitta d and the chord length a is:

$$\frac{a}{13} < d \le \frac{a}{2},$$

thereby the impact of the spurious mode on the filter characteristic of bulk acoustic wave resonator is reduced.

Figure 2G:
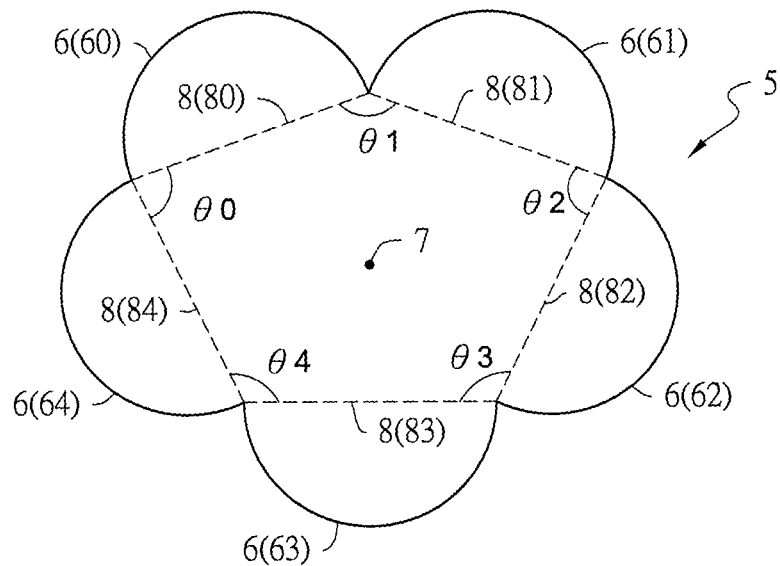
FIG. 2G is a top view of another embodiment having five curved edges of a resonance structure of bulk acoustic wave resonator of the present invention.

Please refer to FIG. 2G is a top view of another embodiment having five curved edges of a resonance structure of bulk acoustic wave resonator of the present invention. The main structure of the embodiment is mostly similar to the structure of the embodiment shown in FIG. 2A, except that five curved edges 6 (curved edge 60, curved edge 61, curved edge 62, curved edge 63 and curved edge 64) are five identical curved edges. Five curved edges 6 are all circular arc. The circular arc may be a minor arc or a semi-circle. A center (not shown in Figure) of the circular arc is located on a perpendicular bisector 9 of the corresponding chord 8. And all the five curved edges 6 have the same curved edge length. All the five chords 8 corresponding to five curved edges 6 have the same chord lengths a. All the five curved edges 6 and their corresponding chords 8 have the same maximum distance sagittas d. All the five curved edges 6 are symmetric with respect to the perpendicular bisectors 9 of the corresponding chords 8. Part of the interior angles θ of the convex pentagon which is formed by the five chords 8 are the same (that is: $\theta_1 > \theta_3 = \theta_4 > \theta_0 = \theta_2$).

Figure 3A:
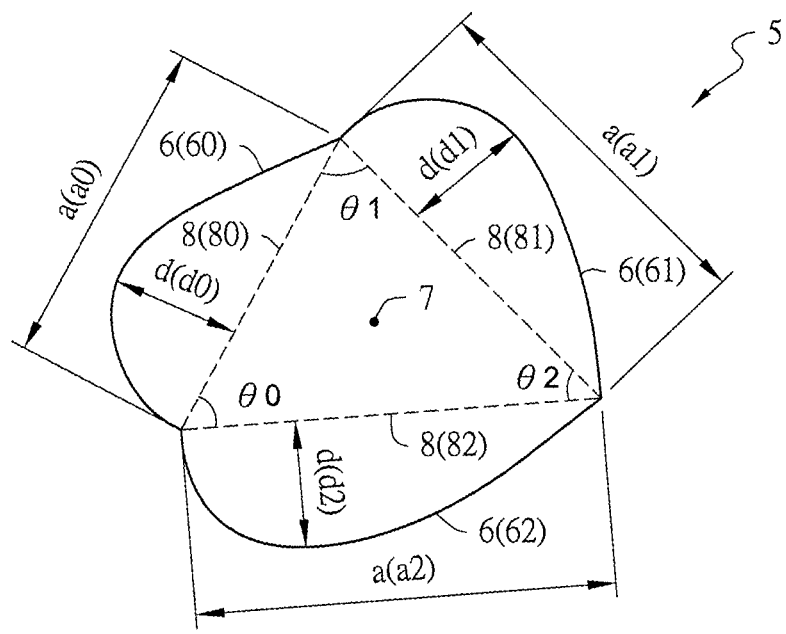
FIG. 3A is a top view of an embodiment having three curved edges of a resonance structure of bulk acoustic wave resonator of the present invention.

Please refer to FIG. 3A is a top view of an embodiment having three curved edges of a resonance structure of bulk acoustic wave resonator of the present invention. The main structure of the embodiment is mostly similar to the structure of the embodiment shown in FIG. 1B, except that the contour 5 includes three curved edges 6 (curved edge 60, curved edge 61 and curved edge 62). Each of curved edges 6 (curved edge 60, curved edge 61 and curved edge 62) is concave to a geometric center 7 of the contour 5. A chord 8 is formed by connecting two endpoints of each curved edge 6 (that is: a chord 80 is formed by connecting two endpoints of curved edge 60; a chord 81 is formed by connecting two endpoints of curved edge 61; and a chord 82 is formed by connecting two endpoints of curved edge 62). Each chord 8 has a chord length a (that is: the chord 80 has a chord length a0; the chord 81 has a chord length a1; and the chord 82 has a chord length a2). A sagitta d is defined as the maximum distance between each curved edge 6 and its corresponding chord 8 (that is: the curved edge 60 and the chord 80 has a maximum distance sagitta d0; the curved edge 61 and the chord 81 has a maximum distance sagitta d1; and the curved edge 62 and the chord 82 has a maximum distance sagitta d2). A triangle is formed by connecting three chords 8 (chord 80, chord 81 and chord 82). An angle θ is defined between each chord 8 and its adjacent chord (that is: an angle $\theta_0$ is defined between the chord 82 and the chord 80; an angle $\theta_1$ is defined between the chord 80 and the chord 81; and an angle $\theta_2$ is defined between the chord 81 and the chord 82). Three angles θ ($\theta_0$, $\theta_1$ and $\theta_2$) are respectively three interior angles of the triangle. Each chord 8 has a perpendicular bisector 9 (as shown in FIG. 1C). Each of curved edges 6 (curved edge 60, curved edge 61 and curved edge 62) may be an elliptical arc, a circular arc, a parabolic arc, a hyperbolic arc or a cycloidal arc. It also may be an arc of other function. In the embodiment of FIG. 3A, three curved edges 6 (curved edge 60, curved edge 61 and curved edge 62) are three non-identical curved edges. Three curved edges 6 are three different kinds of arcs respectively. And three curved edges 6 have different curved edge lengths respectively. The three chords 8 corresponding to three curved edges 6 have different chord lengths a respectively. Three curved edges 6 and their corresponding chords 8 have different maximum distance sagittas d respectively. Three curved edges 6 are respectively asymmetric with respect to the perpendicular bisectors 9 of their corresponding chords 8. The triangle formed by connecting three chords 8 has three different interior angles θ. In an embodiment, each interior angle of the triangle is greater than or equal to 45° and less than or equal 90°. In a preferable embodiment, the relation between the sagitta d and the chord length a is:

$$\frac{a}{13} < d \le \frac{a}{2},$$

thereby the impact of the spurious mode on the filter characteristic of bulk acoustic wave resonator is reduced.

Figure 3B:
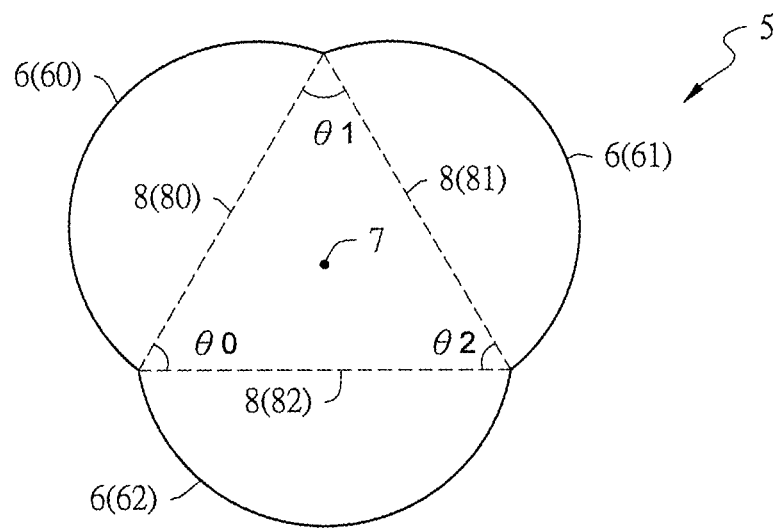
FIG. 3B is a top view of another embodiment having three curved edges of a resonance structure of bulk acoustic wave resonator of the present invention.

Please refer to FIG. 3B, which is a top view of another embodiment having three curved edges of a resonance structure of bulk acoustic wave resonator of the present invention. The main structure of the embodiment is mostly similar to the structure of the embodiment shown in FIG. 3A, except that three curved edges 6 (curved edge 60, curved edge 61 and curved edge 62) are three identical curved edges. Three curved edges 6 are all circular arc. The circular arc may be a minor arc or a semi-circle. A center (not shown in Figure) of the circular arc is located on a perpendicular bisector 9 of the corresponding chord 8. And all the three curved edges 6 have the same curved edge length. All the three chords 8 corresponding to three curved edges 6 have the same chord lengths a. All the three curved edges 6 and their corresponding chords 8 have the same maximum distance sagittas d. All the three curved edges 6 are symmetric with respect to the perpendicular bisectors 9 of the corresponding chords 8. All the interior angles θ of the triangle which is formed by the three chords 8 are the same (that is: $\theta_0 = \theta_1 = \theta_2 = 60°$).

Figure 3C:
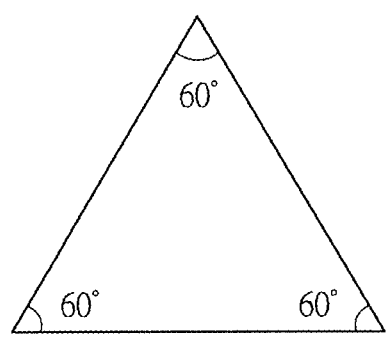
FIG. 3C is a top view of a resonance structure of bulk acoustic wave resonator having an equilateral triangle contour.
Figure 3D:
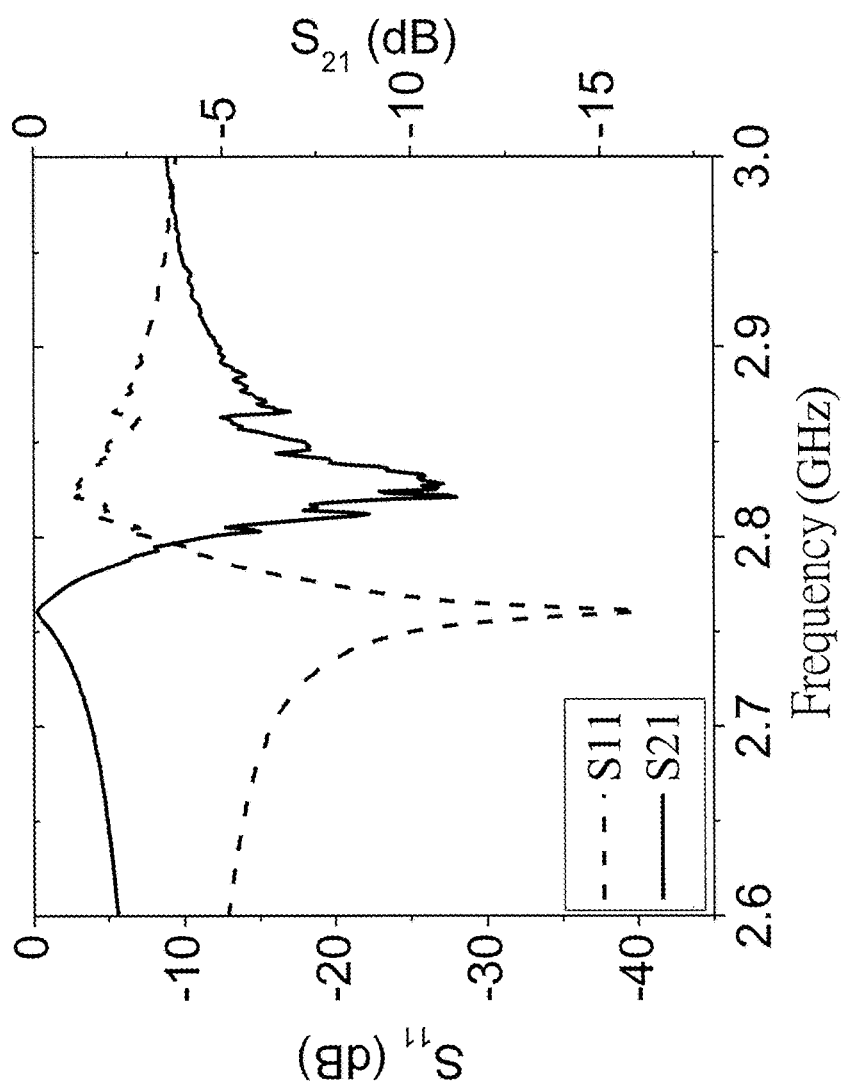
FIG. 3D is the frequency response graph of a resonance structure of bulk acoustic wave resonator having an equilateral triangle contour as shown in FIG. 3C.

Please refer to FIG. 3C, which is a top view of a resonance structure of bulk acoustic wave resonator having an equilateral triangle contour. Please also refer to FIG. 3D, which is the frequency response graph of a resonance structure of bulk acoustic wave resonator having an equilateral triangle contour as shown in FIG. 3C. $S_{11}$ is the ratio of the transmission electromagnetic wave and the incident electromagnetic wave, while $S_{21}$ is the ratio of the reflection electromagnetic wave and the incident electromagnetic wave. In FIG. 3D, it shows that spurious modes seriously affect the filter characteristic of the bulk acoustic wave resonator.

Figure 3E:
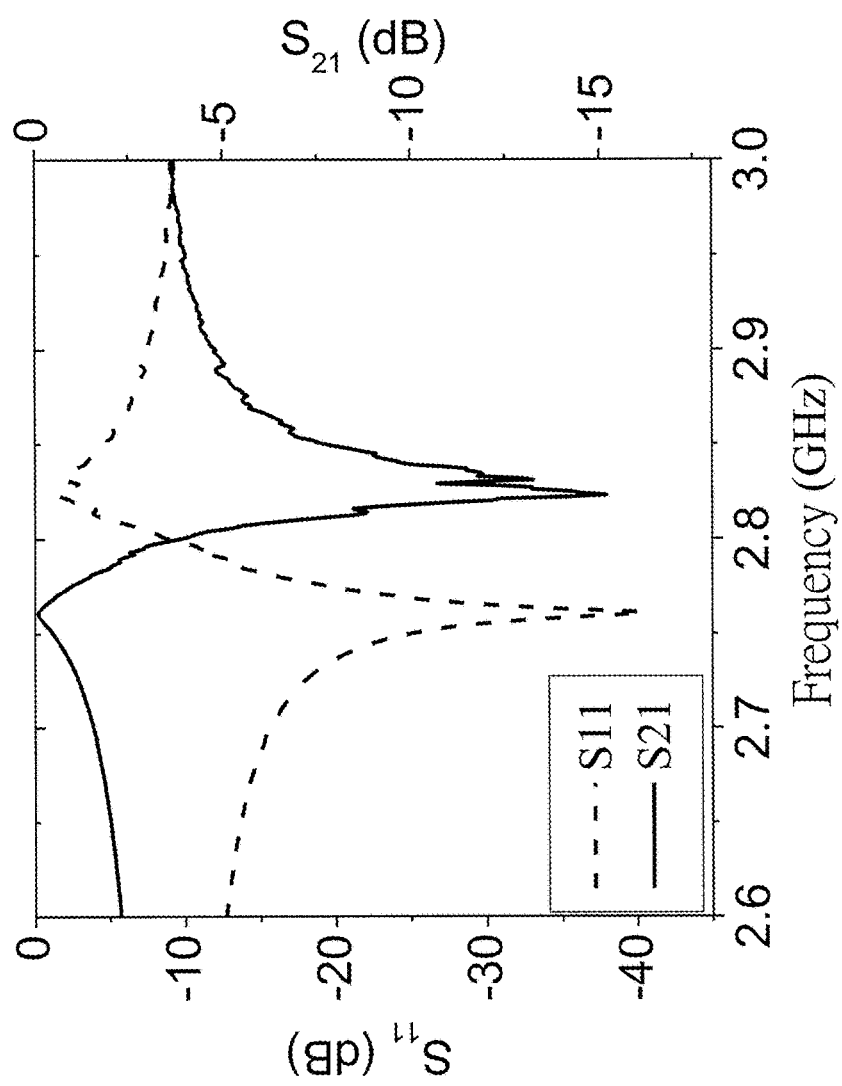
FIG. 3E is the frequency response graph of an embodiment having three curved edges of a resonance structure of bulk acoustic wave resonator of the present invention as shown in FIG. 3B.

Please refer to FIG. 3E, which is the frequency response graph of an embodiment having three curved edges of a resonance structure of bulk acoustic wave resonator of the present invention as shown in FIG. 3B. The contour of the resonance structure of current embodiment is formed by replacing the straight line edges of the equilateral triangle contour of FIG. 3C by three semi-circles of curved edges 6. And the relation between the sagitta d and the chord length a is:

$$d = \frac{a}{2}.$$

is the ratio of the transmission electromagnetic wave and the incident electromagnetic wave, while $S_{21}$ is the ratio of the reflection electromagnetic wave and the incident electromagnetic wave. Compare to FIG. 3D, which is the frequency response graph of a resonance structure of bulk acoustic wave resonator having an equilateral triangle contour, in FIG. 3E the spurious modes appeared between the lowest point of $S_{11}$ and the lowest point of $S_{21}$ is significantly suppressed, or the frequency of the spurious modes depart from the range between the lowest point of $S_{11}$ and the lowest point of $S_{21}$.

Figure 4A:
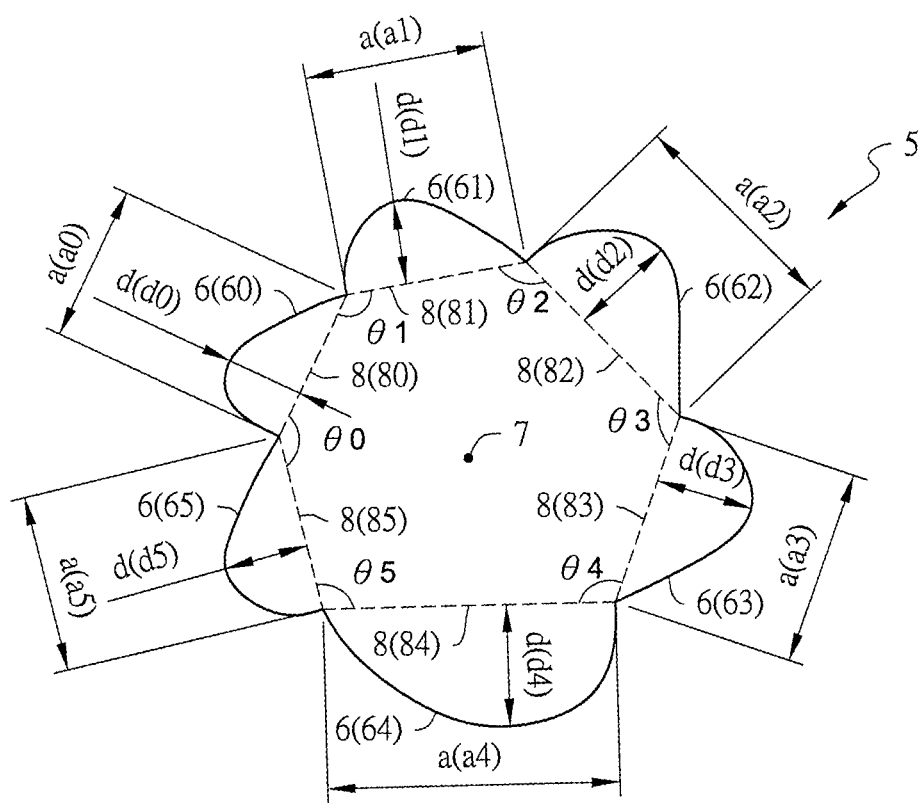
FIG. 4A is a top view of an embodiment having six curved edges of a resonance structure of bulk acoustic wave resonator of the present invention.

Please refer to FIG. 4A is a top view of an embodiment having six curved edges of a resonance structure of bulk acoustic wave resonator of the present invention. The main structure of the embodiment is mostly similar to the structure of the embodiment shown in FIG. 1B, except that the contour 5 includes six curved edges 6 (curved edge 60, curved edge 61, curved edge 62, curved edge 63, curved edge 64 and curved edge 65). Each of curved edges 6 (curved edge 60, curved edge 61, curved edge 62, curved edge 63, curved edge 64 and curved edge 65) is concave to a geometric center 7 of the contour 5. A chord 8 is formed by connecting two endpoints of each curved edge 6 (that is: a chord 80 is formed by connecting two endpoints of curved edge 60; a chord 81 is formed by connecting two endpoints of curved edge 61; a chord 82 is formed by connecting two endpoints of curved edge 62; a chord 83 is formed by connecting two endpoints of curved edge 63; a chord 84 is formed by connecting two endpoints of curved edge 64; and a chord 85 is formed by connecting two endpoints of curved edge 65). Each chord 8 has a chord length a (that is: the chord 80 has a chord length a0; the chord 81 has a chord length a1; the chord 82 has a chord length a2; the chord 83 has a chord length a3; the chord 84 has a chord length a4; and the chord 85 has a chord length a5). A sagitta d is defined as the maximum distance between each curved edge 6 and its corresponding chord 8 (that is: the curved edge 60 and the chord 80 has a maximum distance sagitta d0; the curved edge 61 and the chord 81 has a maximum distance sagitta d1; the curved edge 62 and the chord 82 has a maximum distance sagitta d2; the curved edge 63 and the chord 83 has a maximum distance sagitta d3; the curved edge 64 and the chord 84 has a maximum distance sagitta d4; and the curved edge 65 and the chord 85 has a maximum distance sagitta d5). A convex hexagon is formed by connecting six chords 8 (chord 80, chord 81, chord 82, chord 83, chord 84 and chord 85). An angle θ is defined between each chord 8 and its adjacent chord (that is: an angle $\theta_0$ is defined between the chord 85 and the chord 80; an angle $\theta_1$ is defined between the chord 80 and the chord 81; an angle $\theta_2$ is defined between the chord 81 and the chord 82; an angle $\theta_3$ is defined between the chord 82 and the chord 83; an angle $\theta_4$ is defined between the chord 83 and the chord 84; and an angle $\theta_5$ is defined between the chord 84 and the chord 85). Six angles θ ($\theta_0$, $\theta_1$, $\theta_2$, $\theta_3$, $\theta_4$ and $\theta_5$) are respectively six interior angles of the convex hexagon. Each chord 8 has a perpendicular bisector 9 (as shown in FIG. 1C). Each of curved edges 6 (curved edge 60, curved edge 61, curved edge 62, curved edge 63, curved edge 64 and curved edge 65) may be an elliptical arc, a circular arc, a parabolic arc, a hyperbolic arc or a cycloidal arc. It also may be an arc of other function. In the embodiment of FIG. 4A, six curved edges 6 (curved edge 60, curved edge 61, curved edge 62, curved edge 63, curved edge 64 and curved edge 65) are six non-identical curved edges. Six curved edges 6 are six different kinds of arcs respectively. And six curved edges 6 have different curved edge lengths respectively. The six chords 8 corresponding to six curved edges 6 have different chord lengths a respectively. Six curved edges 6 and their corresponding chords 8 have different maximum distance sagittas d respectively. Six curved edges 6 are respectively asymmetric with respect to the perpendicular bisectors 9 of their corresponding chords 8. The convex hexagon formed by connecting six chords 8 has six different interior angles θ. In an embodiment, each interior angle of the convex hexagon is greater than or equal to 75° and less than or equal 180°. In a preferable embodiment, the relation between the sagitta d and the chord length a is:

$$\left(\frac{\sqrt{2}-1}{2}\right)a < d \leq \frac{a}{2},$$

thereby the impact of the spurious mode on the filter characteristic of bulk acoustic wave resonator is reduced.

Figure 4B:
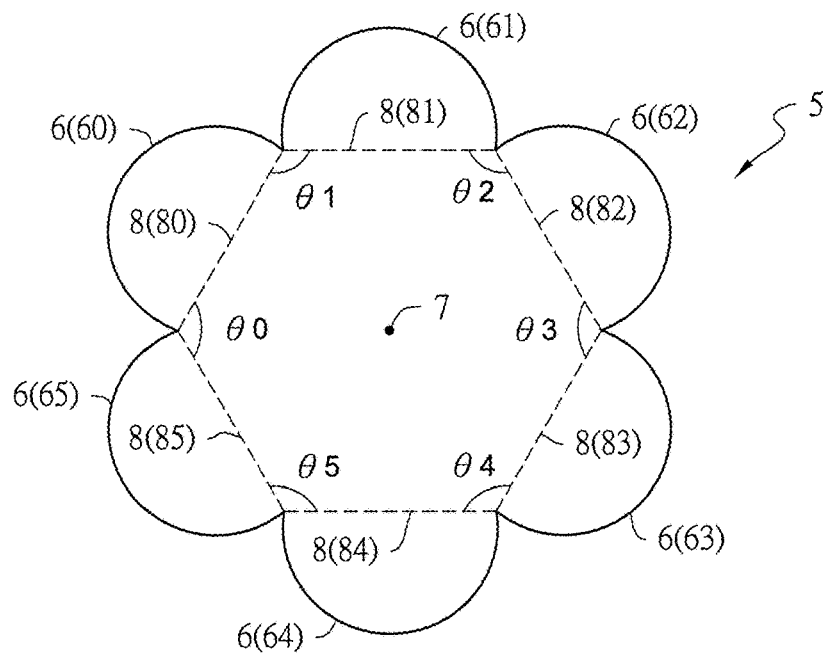
FIG. 4B is a top view of another embodiment having six curved edges of a resonance structure of bulk acoustic wave resonator of the present invention.

Please refer to FIG. 4B, which is a top view of another embodiment having six curved edges of a resonance structure of bulk acoustic wave resonator of the present invention. The main structure of the embodiment is mostly similar to the structure of the embodiment shown in FIG. 4A, except that six curved edges 6 (curved edge 60, curved edge 61, curved edge 62, curved edge 63, curved edge 64 and curved edge 65) are six identical curved edges. Six curved edges 6 are all circular arc. The circular arc may be a minor arc or a semi-circle. A center (not shown in Figure) of the circular arc is located on a perpendicular bisector 9 of the corresponding chord 8. And all the six curved edges 6 have the same curved edge length. All the six chords 8 corresponding to six curved edges 6 have the same chord lengths a. All the six curved edges 6 and their corresponding chords 8 have the same maximum distance sagittas d. All the six curved edges 6 are symmetric with respect to the perpendicular bisectors 9 of the corresponding chords 8. All the interior angles θ of the convex hexagon which is formed by the six chords 8 are the same (that is: $\theta_0 = \theta_1 = \theta_2 = \theta_3 = \theta_4 = \theta_5 = 120°$).

Figure 4C:
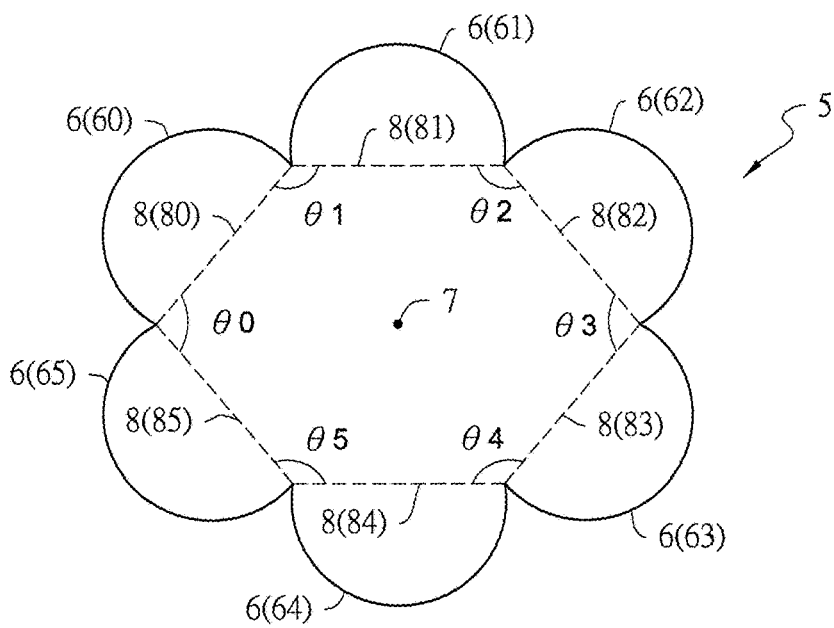
FIG. 4C is a top view of another embodiment having six curved edges of a resonance structure of bulk acoustic wave resonator of the present invention.

Please refer to FIG. 4C, which is a top view of another embodiment having six curved edges of a resonance structure of bulk acoustic wave resonator of the present invention. The main structure of the embodiment is mostly similar to the structure of the embodiment shown in FIG. 4A, except that six curved edges 6 (curved edge 60, curved edge 61, curved edge 62, curved edge 63, curved edge 64 and curved edge 65) are six identical curved edges. Six curved edges 6 are all circular arc. The circular arc may be a minor arc or a semi-circle. A center (not shown in Figure) of the circular arc is located on a perpendicular bisector 9 of the corresponding chord 8. And all the six curved edges 6 have the same curved edge length. All the six chords 8 corresponding to six curved edges 6 have the same chord lengths a. All the six curved edges 6 and their corresponding chords 8 have the same maximum distance sagittas d. All the six curved edges 6 are symmetric with respect to the perpendicular bisectors 9 of the corresponding chords 8. Part of the interior angles θ of the convex hexagon which is formed by the six chords 8 are the same (that is: $\theta_1 = \theta_2 = \theta_4 = \theta_5 > \theta_0 = \theta_3$).

Figure 5A:
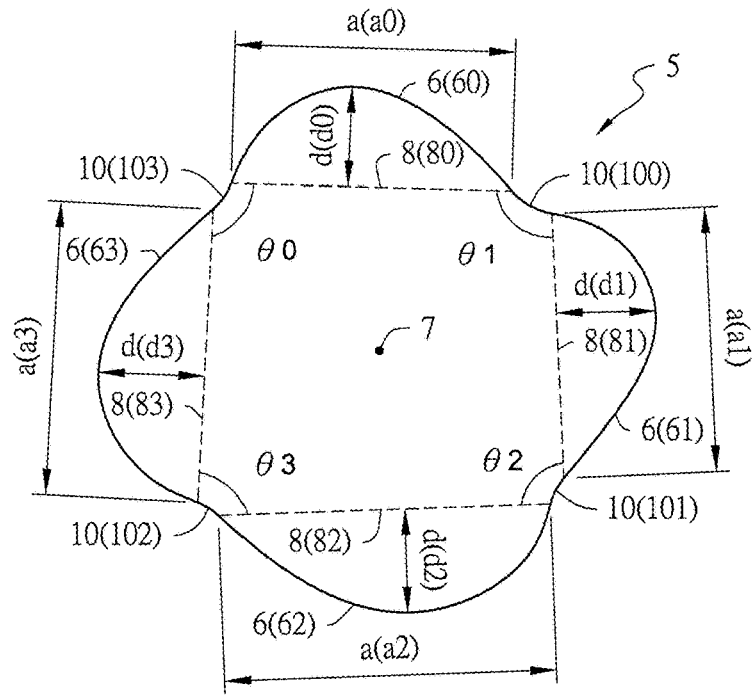
FIG. 5A is a top view of an embodiment having four curved edges of a resonance structure of bulk acoustic wave resonator of the present invention.

Please refer to FIG. 5A, which is a top view of an embodiment having four curved edges of a resonance structure of bulk acoustic wave resonator of the present invention. The main structure of the embodiment is mostly similar to the structure of the embodiment shown in FIG. 1B, except that it further comprises four linking curved edges 10 (linking curved edge 100, linking curved edge 101, linking curved edge 102 and linking curved edge 103). Each of linking curved edges 10 (linking curved edge 100, linking curved edge 101, linking curved edge 102 and linking curved edge 103) is concave to a geometric center 7 of the contour 5. Two endpoints of each linking curved edge 10 are connected with two curved edges 6 respectively (that is: linking curved edge 100 is connected with curved edge 60 and curved edge 61; linking curved edge 101 is connected with curved edge 61 and curved edge 62; linking curved edge 102 is connected with curved edge 62 and curved edge 63; and linking curved edge 103 is connected with curved edge 63 and curved edge 60) such that the contour 5 is formed a smooth curve without the presence of a singular point. A convex quadrilateral (not shown in Figure) is formed by extending four chords 8 (chord 80, chord 81, chord 82 and chord 83) and connecting all the extended chords. An angle θ is defined between each chord 8 and its adjacent chord (that is: an angle $\theta_0$ is defined between the chord 83 and the chord 80; an angle $\theta_1$ is defined between the chord 80 and the chord 81; an angle $\theta_2$ is defined between the chord 81 and the chord 82; and an angle $\theta_3$ is defined between the chord 82 and the chord 83). Four angles θ ($\theta_0$, $\theta_1$, $\theta_2$ and $\theta_3$) are respectively four interior angles of the convex quadrilateral. Each of linking curved edges 10 (linking curved edge 100, linking curved edge 101, linking curved edge 102 and linking curved edge 103) may be an elliptical arc, a circular arc, a parabolic arc, a hyperbolic arc or a cycloidal arc. It also may be an arc of other function. In the embodiment of FIG. 5A, four linking curved edges 10 (linking curved edge 100, linking curved edge 101, linking curved edge 102 and linking curved edge 103) are four non-identical linking curved edges. Four linking curved edges 10 are four different kinds of arcs respectively. And four linking curved edges 10 have different linking curved edge lengths respectively. The embodiment of FIG. 5A is formed by inserting a linking curved edge 10 in between each two adjacent curved edges 6 of the embodiment of FIG. 1B such that the contour 5 is formed a smooth curve without the presence of a singular point. Thus, the singular point at the intersection of each two adjacent curved edges 6 of the embodiment of FIG. 1B no longer exists. Instead of the straight line edges of the convex quadrilateral of conventional technology, the contour of the resonance structure of the bulk acoustic wave resonator of the present invention is formed by the curved edges, and furthermore by using the linking curved edge to remove the singular point of the contour to form a smooth curve contour. Thereby the resonant path of the lateral wave is further lengthened such that the energy of the spurious mode is reduced in order to suppress the spurious mode close to the frequency of the vertical wave resonance, and/or the frequency of the lateral wave resonance is departing from the frequency of the vertical wave resonance. Therefore the impact of the spurious mode on the filter characteristic of the bulk acoustic wave resonator is reduced. In an embodiment, a ratio of a length of each linking curved edge and a length of any one of the two curved edges adjacent to the linking curved edge is between 1:5 and 1:50. In an embodiment, each interior angle of the convex quadrilateral is greater than or equal to 60° and less than or equal 135°. In a preferable embodiment, the relation between the sagitta d and the chord length a is:

$$\left(\frac{\sqrt{2}-1}{2}\right)a < d \leq \frac{a}{2},$$

thereby the impact of the spurious mode on the filter characteristic of bulk acoustic wave resonator is reduced.

In an embodiment, the main structure is mostly similar to the structure of the embodiment shown in FIG. 5A, except that it comprises three linking curved edges 10. In another embodiment, the main structure is mostly similar to the structure of the embodiment shown in FIG. 5A, except that it comprises two linking curved edges 10. In an embodiment, the main structure is mostly similar to the structure of the embodiment shown in FIG. 5A, except that it comprises only one linking curved edge 10. In an embodiment, the main structure is mostly similar to the structure of the embodiment shown in FIG. 5A, except that part of the four linking curved edges 10 are the same kind of arc. In another embodiment, the main structure is mostly similar to the structure of the embodiment shown in FIG. 5A, except that all the four linking curved edges 10 are the same kind of arc. In an embodiment, the main structure is mostly similar to the structure of the embodiment shown in FIG. 5A, except that part of the four linking curved edges 10 have the same linking curved edge length. In another embodiment, the main structure is mostly similar to the structure of the embodiment shown in FIG. 5A, except that all the four linking curved edges 10 have the same linking curved edge length. In an embodiment, the main structure is mostly similar to the structure of the embodiment shown in FIG. 5A, except that part of the interior angles θ of the convex quadrilateral which is formed by the four extended chords 8 are the same. In another embodiment, the main structure is mostly similar to the structure of the embodiment shown in FIG. 5A, except that all the interior angles θ of the convex quadrilateral which is formed by the four extended chords 8 are the same.

Figure 5B:
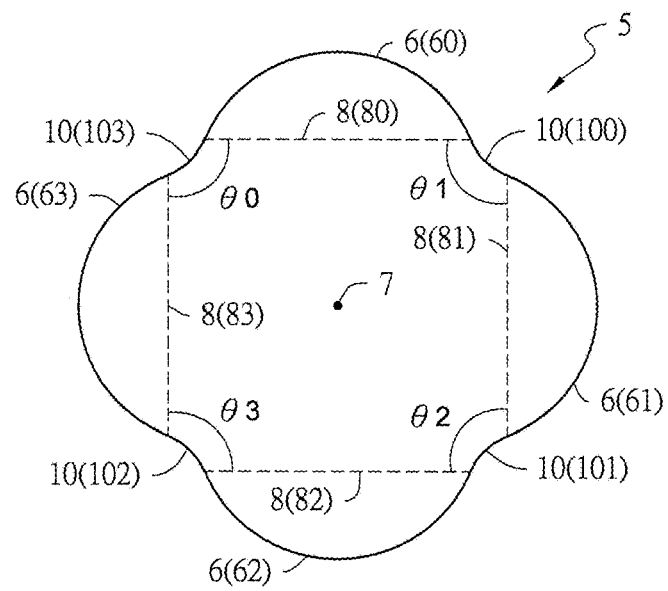
FIG. 5B is a top view of another embodiment having four curved edges of a resonance structure of bulk acoustic wave resonator of the present invention.

Please refer to FIG. 5B, which is a top view of another embodiment having four curved edges of a resonance structure of bulk acoustic wave resonator of the present invention. The main structure of the embodiment is mostly similar to the structure of the embodiment shown in FIG. 5A, except that four curved edges 6 (curved edge 60, curved edge 61, curved edge 62 and curved edge 63) are four identical curved edges, and four linking curved edges 10 (linking curved edge 100, linking curved edge 101, linking curved edge 102 and linking curved edge 103) are four identical linking curved edges. Four curved edges 6 are all circular arc. The circular arc may be a minor arc or a semi-circle. A center (not shown in Figure) of the circular arc is located on a perpendicular bisector 9 of the corresponding chord 8. And all the four curved edges 6 have the same curved edge length. And all the four linking curved edges 10 have the same linking curved edge length. All the four chords 8 corresponding to four curved edges 6 have the same chord lengths a. All the four curved edges 6 and their corresponding chords 8 have the same maximum distance sagittas d. All the four curved edges 6 are symmetric with respect to the perpendicular bisectors 9 of the corresponding chords 8. All the interior angles θ of the convex quadrilateral which is formed by the four extended chords 8 are the same (that is: $\theta_0=\theta_1=\theta_2=\theta_3=90°$).

Figure 5C:
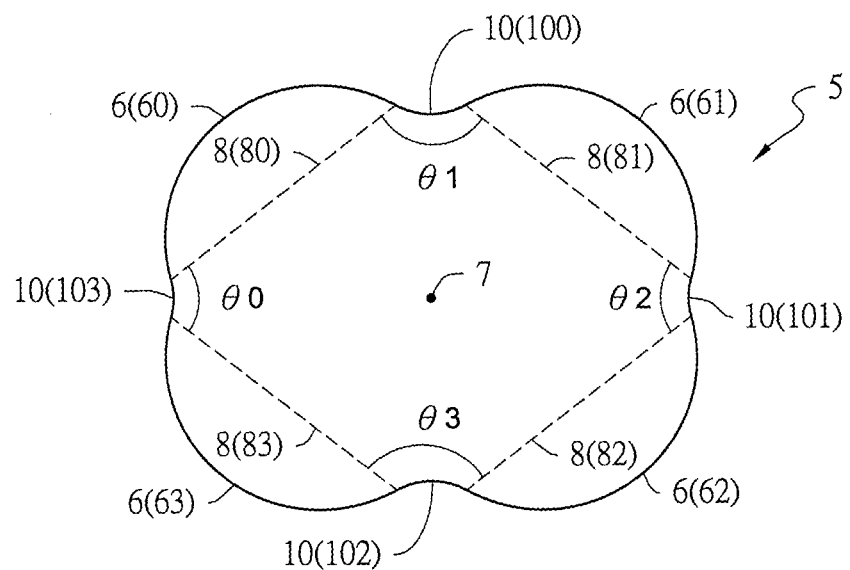
FIG. 5C is a top view of another embodiment having four curved edges of a resonance structure of bulk acoustic wave resonator of the present invention.

Please refer to FIG. 5C, which is a top view of another embodiment having four curved edges of a resonance structure of bulk acoustic wave resonator of the present invention. The main structure of the embodiment is mostly similar to the structure of the embodiment shown in FIG. 5A, except that four curved edges 6 (curved edge 60, curved edge 61, curved edge 62 and curved edge 63) are four identical curved edges, and part of the four linking curved edges 10 (linking curved edge 100, linking curved edge 101, linking curved edge 102 and linking curved edge 103) are identical linking curved edges. Four curved edges 6 are all circular arc. The circular arc may be a minor arc or a semi-circle. A center (not shown in Figure) of the circular arc is located on a perpendicular bisector 9 of the corresponding chord 8. And all the four curved edges 6 have the same curved edge length. All the four chords 8 corresponding to four curved edges 6 have the same chord lengths a. All the four curved edges 6 and their corresponding chords 8 have the same maximum distance sagittas d. All the four curved edges 6 are symmetric with respect to the perpendicular bisectors 9 of the corresponding chords 8. Part of the interior angles θ of the convex quadrilateral which is formed by the four extended chords 8 are the same (that is: $\theta_0=\theta_2<\theta_1=\theta_3$).

Figure 5D:
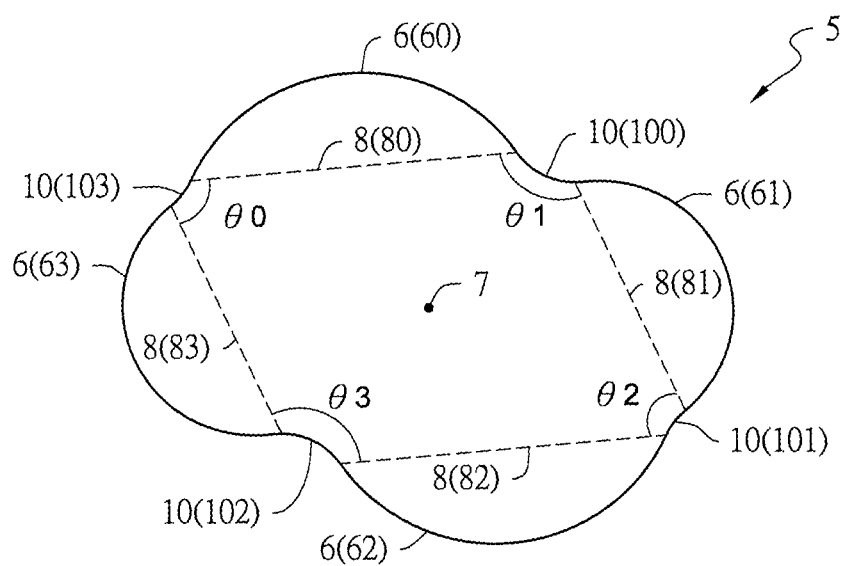
FIG. 5D is a top view of another embodiment having four curved edges of a resonance structure of bulk acoustic wave resonator of the present invention.

Please refer to FIG. 5D, which is a top view of another embodiment having four curved edges of a resonance structure of bulk acoustic wave resonator of the present invention. The main structure of the embodiment is mostly similar to the structure of the embodiment shown in FIG. 5A, except that part of the four curved edges 6 (curved edge 60, curved edge 61, curved edge 62 and curved edge 63) are identical curved edges, and part of the four linking curved edges 10 (linking curved edge 100, linking curved edge 101, linking curved edge 102 and linking curved edge 103) are identical linking curved edges; wherein curved edge 60 and curved edge 62 are identical curved edges; curved edge 61 and curved edge 63 are identical curved edges. Four curved edges 6 are all circular arc. The circular arc may be a minor arc or a semi-circle. A center (not shown in Figure) of the circular arc is located on a perpendicular bisector 9 of the corresponding chord 8. And part of the four curved edges 6 have the same curved edge length; wherein curved edge 60 and curved edge 62 have the same curved edge length; curved edge 61 and curved edge 63 have the same curved edge length. Part of the four chords 8 corresponding to four curved edges 6 have the same chord lengths a (that is: the chord length a0 of the chord 80=the chord length a2 of the chord 82>the chord length a1 of the chord 81=the chord length a3 of the chord 83). All the four curved edges 6 and their corresponding chords 8 have the same maximum distance sagittas d. All the four curved edges 6 are symmetric with respect to the perpendicular bisectors 9 of the corresponding chords 8. Part of the interior angles θ of the convex quadrilateral which is formed by the four extended chords 8 are the same (that is: $\theta_0=\theta_2<\theta_1=\theta_3$).

Figure 6A:
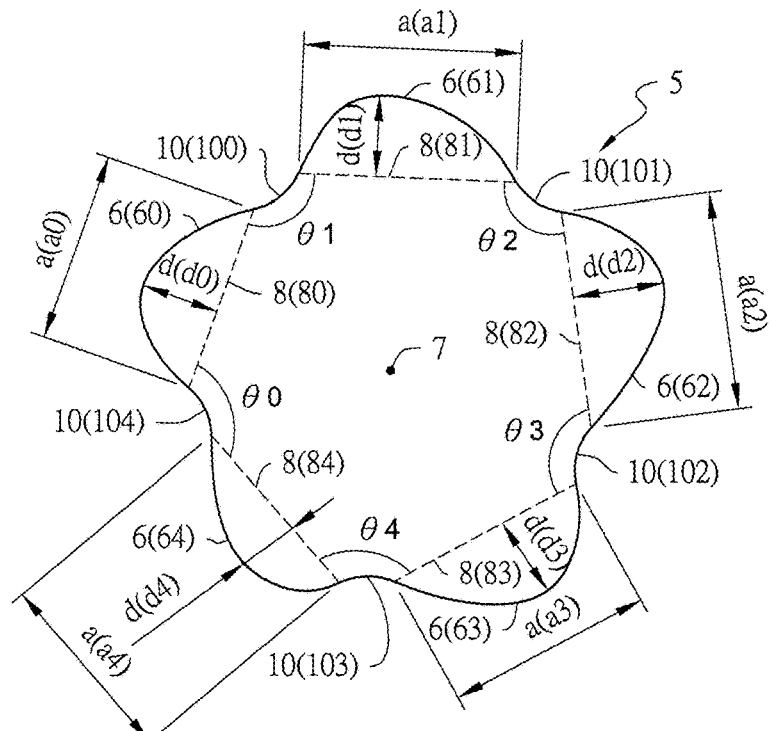
FIG. 6A is a top view of an embodiment having five curved edges of a resonance structure of bulk acoustic wave resonator of the present invention.

Please refer to FIG. 6A, which is a top view of an embodiment having five curved edges of a resonance structure of bulk acoustic wave resonator of the present invention. The main structure of the embodiment is mostly similar to the structure of the embodiment shown in FIG. 2A, except that it further comprises five linking curved edges 10 (linking curved edge 100, linking curved edge 101, linking curved edge 102, linking curved edge 103 and linking curved edge 104). Each of linking curved edges 10 (linking curved edge 100, linking curved edge 101, linking curved edge 102, linking curved edge 103 and linking curved edge 104) is concave to a geometric center 7 of the contour 5. Two endpoints of each linking curved edge 10 are connected with two curved edges 6 respectively (that is: linking curved edge 100 is connected with curved edge 60 and curved edge 61; linking curved edge 101 is connected with curved edge 61 and curved edge 62; linking curved edge 102 is connected with curved edge 62 and curved edge 63; linking curved edge 103 is connected with curved edge 63 and curved edge 64; and linking curved edge 104 is connected with curved edge 64 and curved edge 60) such that the contour 5 is formed a smooth curve without the presence of a singular point. A convex pentagon (not shown in Figure) is formed by extending five chords 8 (chord 80, chord 81, chord 82, chord 83 and chord 84) and connecting all the extended chords. An angle θ is defined between each chord 8 and its adjacent chord (that is: an angle $\theta_0$ is defined between the chord 84 and the chord 80; an angle $\theta_1$ is defined between the chord 80 and the chord 81; an angle $\theta_2$ is defined between the chord 81 and the chord 82; an angle $\theta_3$ is defined between the chord 82 and the chord 83; and an angle $\theta_4$ is defined between the chord 83 and the chord 84). Five angles θ ($\theta_0$, $\theta_1$, $\theta_2$, $\theta_3$ and $\theta_4$) are respectively five interior angles of the convex pentagon. Each of linking curved edges 10 (linking curved edge 100, linking curved edge 101, linking curved edge 102, linking curved edge 103 and linking curved edge 104) may be an elliptical arc, a circular arc, a parabolic arc, a hyperbolic arc or a cycloidal arc. It also may be an arc of other function. In the embodiment of FIG. 6A, five linking curved edges 10 (linking curved edge 100, linking curved edge 101, linking curved edge 102, linking curved edge 103 and linking curved edge 104) are five non-identical linking curved edges. Five linking curved edges 10 are five different kinds of arcs respectively. And five linking curved edges 10 have different linking curved edge lengths respectively. In an embodiment, each interior angle of the convex pentagon is greater than or equal to 65° and less than or equal 170°. In a preferable embodiment, the relation between the sagitta d and the chord length a is:

$$\frac{a}{13} < d \leq \frac{a}{2},$$

thereby the impact of the spurious mode on the filter characteristic of bulk acoustic wave resonator is reduced.

Figure 6B:
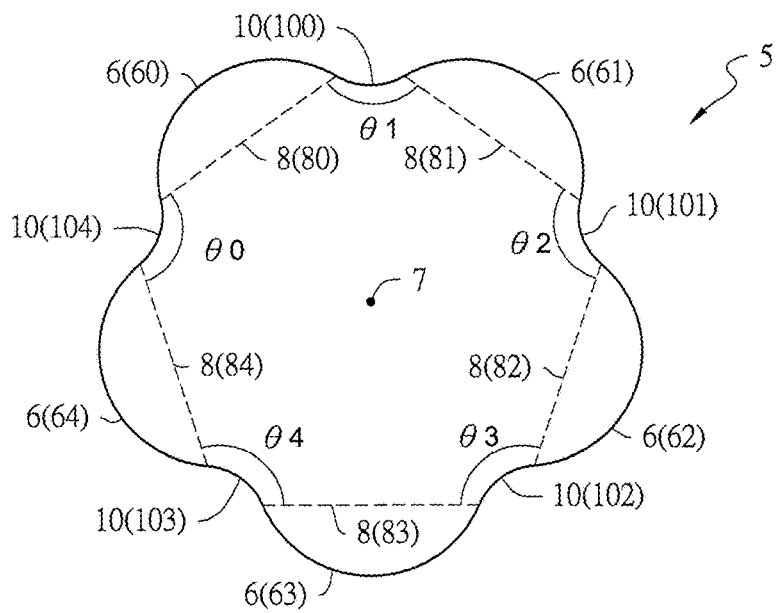
FIG. 6B is a top view of another embodiment having five curved edges of a resonance structure of bulk acoustic wave resonator of the present invention.

Please refer to FIG. 6B, which is a top view of another embodiment having five curved edges of a resonance structure of bulk acoustic wave resonator of the present invention. The main structure of the embodiment is mostly similar to the structure of the embodiment shown in FIG. 6A, except that five curved edges 6 (curved edge 60, curved edge 61, curved edge 62, curved edge 63 and curved edge 64) are five identical curved edges, and five linking curved edges 10 (linking curved edge 100, linking curved edge 101, linking curved edge 102, linking curved edge 103 and linking curved edge 104) are five identical linking curved edges. Five curved edges 6 are all circular arc. The circular arc may be a minor arc or a semi-circle. A center (not shown in Figure) of the circular arc is located on a perpendicular bisector 9 of the corresponding chord 8. And all the five curved edges 6 have the same curved edge length. And all the five linking curved edges 10 have the same linking curved edge length. All the five chords 8 corresponding to five curved edges 6 have the same chord lengths a. All the five curved edges 6 and their corresponding chords 8 have the same maximum distance sagittas d. All the five curved edges 6 are symmetric with respect to the perpendicular bisectors 9 of the corresponding chords 8. All the interior angles θ of the convex pentagon which is formed by the five extended chords 8 are the same (that is: $\theta_0 = \theta_1 = \theta_2 = \theta_3 = \theta_4 = 108°$).

Figure 6C:
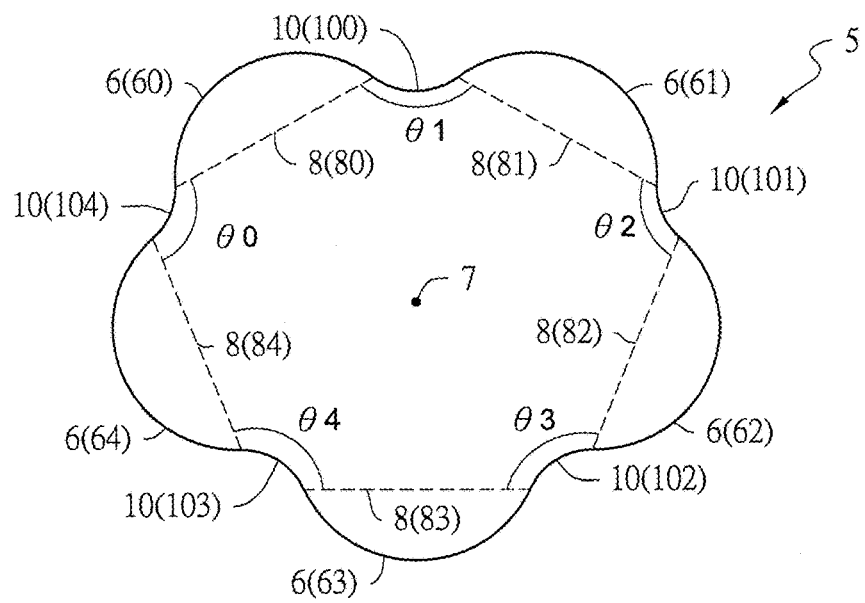
FIG. 6C is a top view of another embodiment having five curved edges of a resonance structure of bulk acoustic wave resonator of the present invention.

Please refer to FIG. 6C, which is a top view of another embodiment having five curved edges of a resonance structure of bulk acoustic wave resonator of the present invention. The main structure of the embodiment is mostly similar to the structure of the embodiment shown in FIG. 6A, except that five curved edges 6 (curved edge 60, curved edge 61, curved edge 62, curved edge 63 and curved edge 64) are five identical curved edges, and part of the five linking curved edges 10 (linking curved edge 100, linking curved edge 101, linking curved edge 102, linking curved edge 103 and linking curved edge 104) are identical linking curved edges. Five curved edges 6 are all circular arc. The circular arc may be a minor arc or a semi-circle. A center (not shown in Figure) of the circular arc is located on a perpendicular bisector 9 of the corresponding chord 8. And all the five curved edges 6 have the same curved edge length. All the five chords 8 corresponding to five curved edges 6 have the same chord lengths a. All the five curved edges 6 and their corresponding chords 8 have the same maximum distance sagittas d. All the five curved edges 6 are symmetric with respect to the perpendicular bisectors 9 of the corresponding chords 8. Part of the interior angles θ of the convex pentagon which is formed by the five extended chords 8 are the same (that is: $\theta_1 > \theta_3 = \theta_4 > \theta_0 = \theta_2$).

Figure 7A:
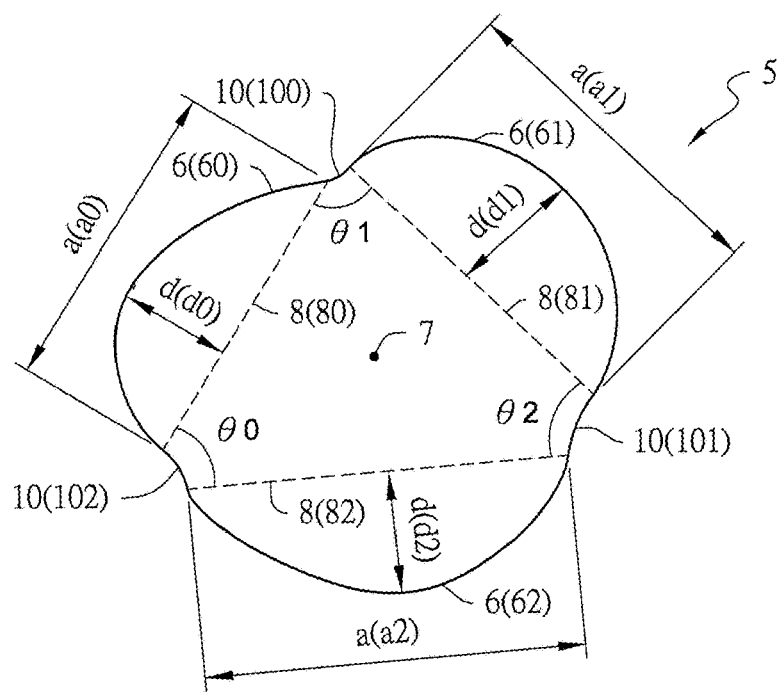
FIG. 7A is a top view of an embodiment having three curved edges of a resonance structure of bulk acoustic wave resonator of the present invention.

Please refer to FIG. 7A, which is a top view of an embodiment having three curved edges of a resonance structure of bulk acoustic wave resonator of the present invention. The main structure of the embodiment is mostly similar to the structure of the embodiment shown in FIG. 3A, except that it further comprises three linking curved edges 10 (linking curved edge 100, linking curved edge 101 and linking curved edge 102). Each of linking curved edges 10 (linking curved edge 100, linking curved edge 101 and linking curved edge 102) is concave to a geometric center 7 of the contour 5. Two endpoints of each linking curved edge 10 are connected with two curved edges 6 respectively (that is: linking curved edge 100 is connected with curved edge 60 and curved edge 61; linking curved edge 101 is connected with curved edge 61 and curved edge 62; and linking curved edge 102 is connected with curved edge 62 and curved edge 60) such that the contour 5 is formed a smooth curve without the presence of a singular point. A triangle (not shown in Figure) is formed by extending three chords 8 (chord 80, chord 81 and chord 82) and connecting all the extended chords. An angle θ is defined between each chord 8 and its adjacent chord (that is: an angle $\theta_0$ is defined between the chord 82 and the chord 80; an angle $\theta_1$ is defined between the chord 80 and the chord 81; and an angle $\theta_2$ is defined between the chord 81 and the chord 82). Three angles θ ($\theta_0$, $\theta_1$ and $\theta_2$) are respectively three interior angles of the triangle. Each of linking curved edges 10 (linking curved edge 100, linking curved edge 101 and linking curved edge 102) may be an elliptical arc, a circular arc, a parabolic arc, a hyperbolic arc or a cycloidal arc. It also may be an arc of other function. In the embodiment of FIG. 7A, three linking curved edges 10 (linking curved edge 100, linking curved edge 101 and linking curved edge 102) are three non-identical linking curved edges. Three linking curved edges 10 are three different kinds of arcs respectively. And three linking curved edges 10 have different linking curved edge lengths respectively. In an embodiment, each interior angle of the triangle is greater than or equal to 45° and less than or equal 90°. In a preferable embodiment, the relation between the sagitta d and the chord length a is:

$$\frac{a}{13} < d \leq \frac{a}{2},$$

thereby the impact of the spurious mode on the filter characteristic of bulk acoustic wave resonator is reduced.

Figure 7B:
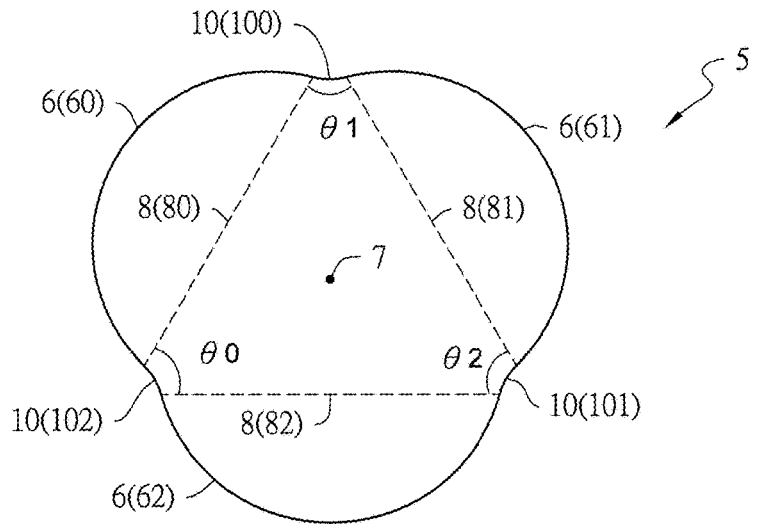
FIG. 7B is a top view of another embodiment having three curved edges of a resonance structure of bulk acoustic wave resonator of the present invention.

Please refer to FIG. 7B, which is a top view of another embodiment having three curved edges of a resonance structure of bulk acoustic wave resonator of the present invention. The main structure of the embodiment is mostly similar to the structure of the embodiment shown in FIG. 7A, except that three curved edges 6 (curved edge 60, curved edge 61 and curved edge 62) are three identical curved edges, and three linking curved edges 10 (linking curved edge 100, linking curved edge 101 and linking curved edge 102) are three identical linking curved edges. Three curved edges 6 are all circular arc. The circular arc may be a minor arc or a semi-circle. A center (not shown in Figure) of the circular arc is located on a perpendicular bisector 9 of the corresponding chord 8. And all the three curved edges 6 have the same curved edge length. And all the three linking curved edges 10 have the same linking curved edge length. All the three chords 8 corresponding to three curved edges 6 have the same chord lengths a. All the three curved edges 6 and their corresponding chords 8 have the same maximum distance sagittas d. All the three curved edges 6 are symmetric with respect to the perpendicular bisectors 9 of the corresponding chords 8. All the interior angles θ of the triangle which is formed by the three extended chords 8 are the same (that is: $\theta_0 = \theta_1 = \theta_2 = 60°$).

Figure 8A:
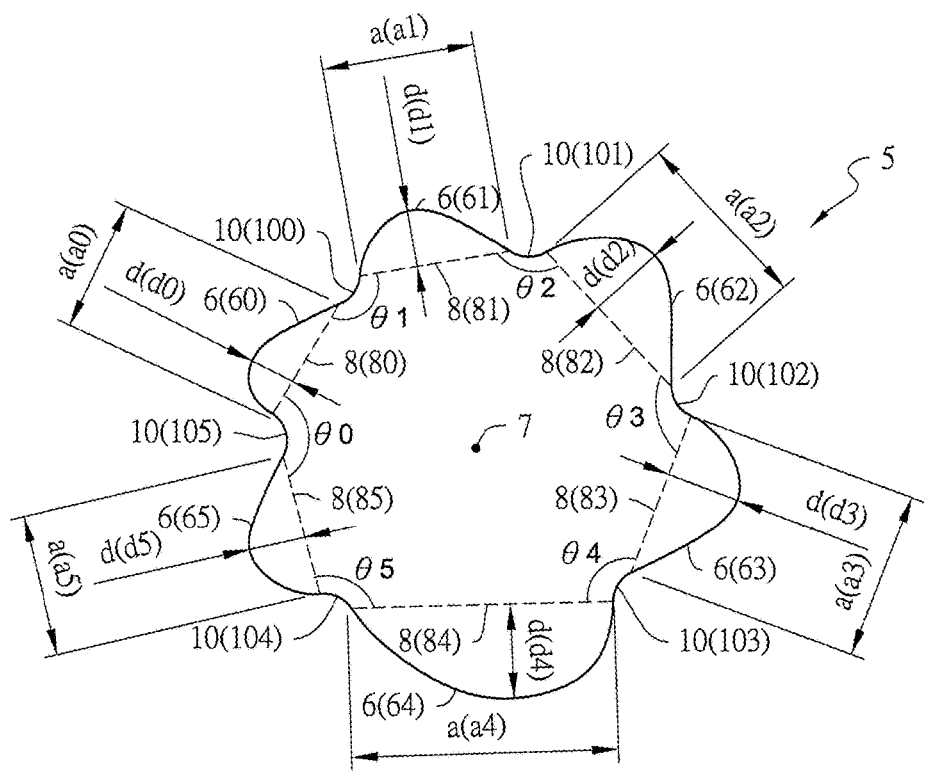
FIG. 8A is a top view of an embodiment having six curved edges of a resonance structure of bulk acoustic wave resonator of the present invention.

Please refer to FIG. 8A, which is a top view of an embodiment having six curved edges of a resonance structure of bulk acoustic wave resonator of the present invention. The main structure of the embodiment is mostly similar to the structure of the embodiment shown in FIG. 4A, except that it further comprises six linking curved edges 10 (linking curved edge 100, linking curved edge 101, linking curved edge 102, linking curved edge 103, linking curved edge 104 and linking curved edge 105). Each of linking curved edges 10 (linking curved edge 100, linking curved edge 101, linking curved edge 102, linking curved edge 103, linking curved edge 104 and linking curved edge 105) is concave to a geometric center 7 of the contour 5. Two endpoints of each linking curved edge 10 are connected with two curved edges 6 respectively (that is: linking curved edge 100 is connected with curved edge 60 and curved edge 61; linking curved edge 101 is connected with curved edge 61 and curved edge 62; linking curved edge 102 is connected with curved edge 62 and curved edge 63; linking curved edge 103 is connected with curved edge 63 and curved edge 64; linking curved edge 104 is connected with curved edge 64 and curved edge 65; and linking curved edge 105 is connected with curved edge 65 and curved edge 60) such that the contour 5 is formed a smooth curve without the presence of a singular point. A convex hexagon (not shown in Figure) is formed by extending six chords 8 (chord 80, chord 81, chord 82, chord 83, chord 84 and chord 85) and connecting all the extended chords. An angle θ is defined between each chord 8 and its adjacent chord (that is: an angle $\theta_0$ is defined between the chord 85 and the chord 80; an angle $\theta_1$ is defined between the chord 80 and the chord 81; an angle $\theta_2$ is defined between the chord 81 and the chord 82; an angle $\theta_3$ is defined between the chord 82 and the chord 83; an angle $\theta_4$ is defined between the chord 83 and the chord 84; and an angle $\theta_5$ is defined between the chord 84 and the chord 85). Six angles ($\theta_0$, $\theta_1$, $\theta_2$, $\theta_3$, $\theta_4$ and $\theta_5$) are respectively six interior angles of the convex hexagon. Each of linking curved edges 10 (linking curved edge 100, linking curved edge 101, linking curved edge 102, linking curved edge 103, linking curved edge 104 and linking curved edge 105) may be an elliptical arc, a circular arc, a parabolic arc, a hyperbolic arc or a cycloidal arc. It also may be an arc of other function. In the embodiment of FIG. 8A, six linking curved edges 10 (linking curved edge 100, linking curved edge 101, linking curved edge 102, linking curved edge 103, linking curved edge 104 and linking curved edge 105) are six non-identical linking curved edges. Six linking curved edges 10 are six different kinds of arcs respectively. And six linking curved edges 10 have different linking curved edge lengths respectively. In an embodiment, each interior angle of the convex hexagon is greater than or equal to 75° and less than or equal 180°. In a preferable embodiment, the relation between the sagitta d and the chord length a is:

$$\left(\frac{\sqrt{2}-1}{2}\right)a < d \leq \frac{a}{2},$$

thereby the impact of the spurious mode on the filter characteristic of bulk acoustic wave resonator is reduced.

Figure 8B:
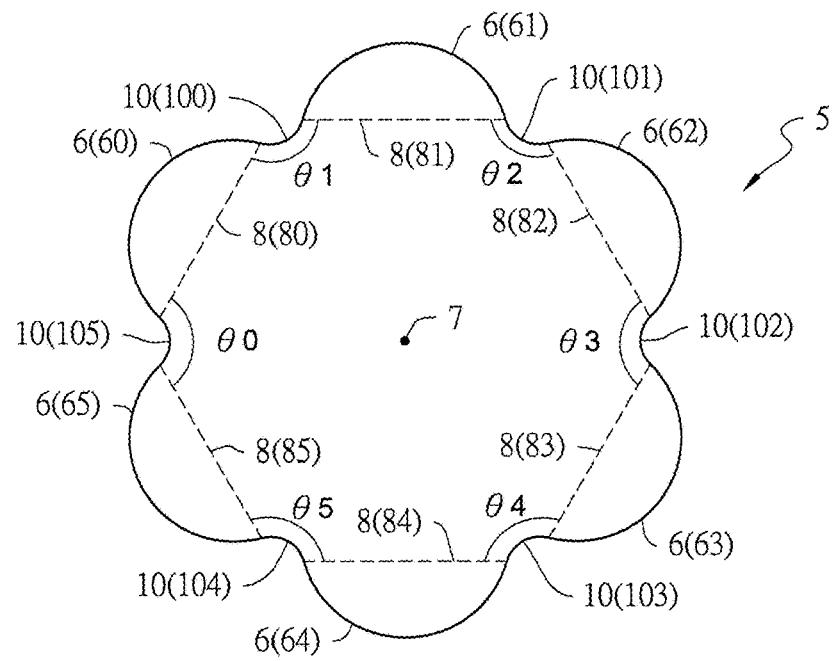
FIG. 8B is a top view of another embodiment having six curved edges of a resonance structure of bulk acoustic wave resonator of the present invention.

Please refer to FIG. 8B, which is a top view of another embodiment having six curved edges of a resonance structure of bulk acoustic wave resonator of the present invention. The main structure of the embodiment is mostly similar to the structure of the embodiment shown in FIG. 8A, except that six curved edges 6 (curved edge 60, curved edge 61, curved edge 62, curved edge 63, curved edge 64 and curved edge 65) are six identical curved edges, and six linking curved edges 10 (linking curved edge 100, linking curved edge 101, linking curved edge 102, linking curved edge 103, linking curved edge 104 and linking curved edge 105) are six identical linking curved edges. Six curved edges 6 are all circular arc. The circular arc may be a minor arc or a semi-circle. A center (not shown in Figure) of the circular arc is located on a perpendicular bisector 9 of the corresponding chord 8. And all the six curved edges 6 have the same curved edge length. And all the six linking curved edges 10 have the same linking curved edge length. All the six chords 8 corresponding to six curved edges 6 have the same chord lengths a. All the six curved edges 6 and their corresponding chords 8 have the same maximum distance sagittas d. All the six curved edges 6 are symmetric with respect to the perpendicular bisectors 9 of the corresponding chords 8. All the interior angles θ of the convex hexagon which is formed by the six extended chords 8 are the same (that is: $\theta_0 = \theta_1 = \theta_2 = \theta_3 = \theta_4 = \theta_5 = 120°$).

Figure 8C:
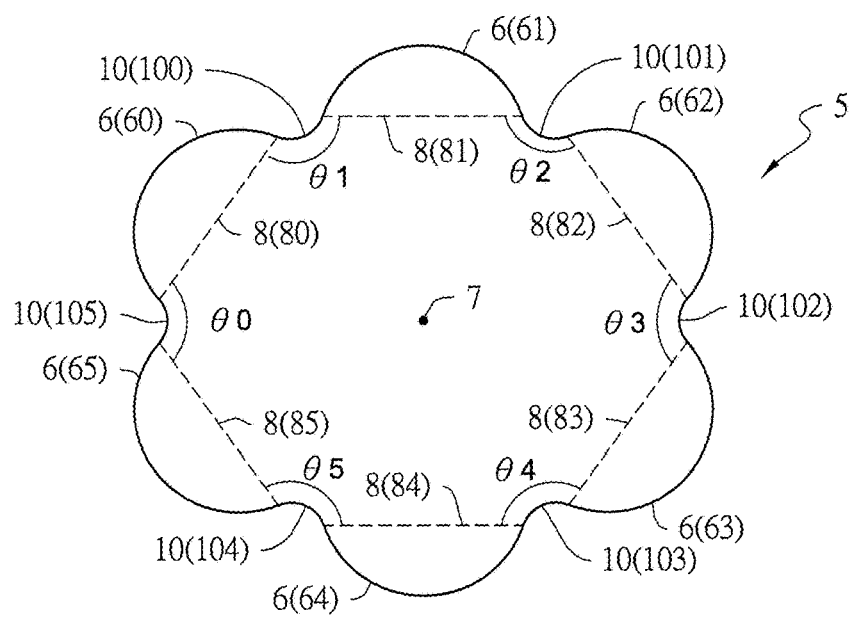
FIG. 8C is a top view of another embodiment having six curved edges of a resonance structure of bulk acoustic wave resonator of the present invention.

Please refer to FIG. 8C, which is a top view of another embodiment having six curved edges of a resonance structure of bulk acoustic wave resonator of the present invention. The main structure of the embodiment is mostly similar to the structure of the embodiment shown in FIG. 8A, except that six curved edges 6 (curved edge 60, curved edge 61, curved edge 62, curved edge 63, curved edge 64 and curved edge 65) are six identical curved edges, and part of the six linking curved edges 10 (linking curved edge 100, linking curved edge 101, linking curved edge 102, linking curved edge 103, linking curved edge 104 and linking curved edge 105) are identical linking curved edges. Six curved edges 6 are all circular arc. The circular arc may be a minor arc or a semi-circle. A center (not shown in Figure) of the circular arc is located on a perpendicular bisector 9 of the corresponding chord 8. And all the six curved edges 6 have the same curved edge length. All the six chords 8 corresponding to six curved edges 6 have the same chord lengths a. All the six curved edges 6 and their corresponding chords 8 have the same maximum distance sagittas d. All the six curved edges 6 are symmetric with respect to the perpendicular bisectors 9 of the corresponding chords 8. Part of the interior angles θ of the convex hexagon which is formed by the six extended chords 8 are the same (that is: $\theta_1=\theta_2=\theta_4=\theta_5>\theta_0=\theta_3$).

In an embodiment, a number of the curved edges 6 is greater than a number of the linking curved edges 10. Two endpoints of each linking curved edge 10 are connected with two curved edges 6 respectively. In another embodiment, a number of the curved edges 6 is equal to a number of the linking curved edges 10. Two endpoints of each linking curved edge 10 are connected with two curved edges 6 respectively, and two endpoints of each curved edge 6 are connected with two linking curved edges 10 respectively. In an embodiment, a chord 8 is formed by connecting two endpoints of each curved edge 6, a convex polygon is formed by extending all chords 8 and connecting all the extended chords, wherein a number of the curved edges 6 is equal to a number of the sides of the convex polygon.

As disclosed in the above description and attached drawings, the present invention can provide a resonance structure of bulk acoustic wave resonator. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A resonance structure of bulk acoustic wave resonator comprising:
   a bottom electrode;
   a dielectric layer formed on said bottom electrode; and
   a top electrode formed on said dielectric layer;
   wherein a resonance area is defined by the overlapping area of the projection of said bottom electrode, said dielectric layer and said top electrode, said resonance area has a contour, said contour includes at least three curved edges and is formed by connecting said at least three curved edges, wherein each curved edge is concave to a geometric center of said contour,
   wherein said at least three curved edges include even number of curved edges, a chord having a chord length a is formed by connecting two endpoints of each curved edge, a sagitta d is defined as the maximum distance between each curved edge and its corresponding chord, wherein:

$$\left(\frac{\sqrt{2}-1}{2}\right)a < d \leq \frac{a}{2}.$$

2. The resonance structure of bulk acoustic wave resonator according to claim 1, wherein said at least three curved edges include at least one selected from the group consisting of an elliptical arc, a circular arc, a parabolic arc, a hyperbolic arc and a cycloidal arc.

3. The resonance structure of bulk acoustic wave resonator according to claim 1, wherein said at least three curved edges include at least one circular arc, a chord is formed by connecting two endpoints of each curved edge, a center of each circular arc is located on a perpendicular bisector of the corresponding chord.

4. The resonance structure of bulk acoustic wave resonator according to claim 3, wherein each circular arc is a minor arc or a semi-circle.

5. The resonance structure of bulk acoustic wave resonator according to claim 3, wherein each circular arc has the same arc length.

6. The resonance structure of bulk acoustic wave resonator according to claim 3, wherein each curved edge is a circular arc.

7. The resonance structure of bulk acoustic wave resonator according to claim 1, wherein a chord is formed by connecting two endpoints of each curved edge, a convex polygon is formed by connecting all chords.

8. The resonance structure of bulk acoustic wave resonator according to claim 7, wherein said at least three curved edges include four curved edges, said convex polygon is a convex quadrilateral, each interior angle of said convex polygon is greater than or equal to 60° and less than or equal to 135°.

9. The resonance structure of bulk acoustic wave resonator according to claim 1, wherein a chord is formed by connecting two endpoints of each curved edge, at least one of the curved edges is symmetric with respect to a perpendicular bisector of the corresponding chord.

10. The resonance structure of bulk acoustic wave resonator according to claim 1, wherein a chord is formed by connecting two endpoints of each curved edge, each curved edge is symmetric with respect to a perpendicular bisector of the corresponding chord.

11. The resonance structure of bulk acoustic wave resonator according to claim 1, wherein a chord is formed by connecting two endpoints of each curved edge, each curved edge is located within the range between two perpendicular lines perpendicular to the corresponding chord and passing through two endpoints of the corresponding chord respectively.

12. The resonance structure of bulk acoustic wave resonator according to claim 1, wherein each curved edge has the same curved edge length.

13. A resonance structure of bulk acoustic wave resonator comprising:
   a bottom electrode;
   a dielectric layer formed on said bottom electrode; and
   a top electrode formed on said dielectric layer;
   wherein a resonance area is defined by the overlapping area of the projection of said bottom electrode, said dielectric layer and said top electrode, said resonance area has a contour, said contour includes at least three curved edges and at least one linking curved edge and is formed by connecting said at least three curved edges and said at least one linking curved edge, wherein each curved edge is concave to a geometric center of said contour, each linking curved edge is convex to said geometric center, wherein a number of said at least three curved edges is greater than or equal to a number of said at least one linking curved edge, two endpoints of each linking curved edge are connected with two curved edges respectively, wherein a ratio of a length of each linking curved edge and a length of any one of the two curved edges adjacent to the linking curved edge is between 1:5 and 1:50.

14. The resonance structure of bulk acoustic wave resonator according to claim 13, wherein said contour formed by connecting said at least three curved edges and said at least one linking curved edge is a smooth curve without the presence of a singular point.

15. The resonance structure of bulk acoustic wave resonator according to claim 13, wherein said number of said at least three curved edges is equal to said number of said at least one linking curved edge, two endpoints of each curved edge are connected with two linking curved edges respectively.

16. The resonance structure of bulk acoustic wave resonator according to claim 13, wherein said at least three curved edges include at least one selected from the group consisting of an elliptical arc, a circular arc, a parabolic arc, a hyperbolic arc and a cycloidal arc.

17. The resonance structure of bulk acoustic wave resonator according to claim 13, wherein said at least three curved edges include even number of curved edges, a chord having a chord length a is formed by connecting two endpoints of each curved edge, a sagitta d is defined as the maximum distance between each curved edge and its corresponding chord, wherein:

$$\left(\frac{\sqrt{2}-1}{2}\right)a < d \le \frac{a}{2}.$$

18. The resonance structure of bulk acoustic wave resonator according to claim 13, wherein said at least three curved edges include odd number of curved edges, a chord having a chord length a is formed by connecting two endpoints of each curved edge, a sagitta d is defined as the maximum distance between each curved edge and its corresponding chord, wherein:

$$\frac{a}{13} < d \le \frac{a}{2}.$$

19. The resonance structure of bulk acoustic wave resonator according to claim 13, wherein said at least three curved edges include at least one circular arc, a chord is formed by connecting two endpoints of each curved edge, a center of each circular arc is located on a perpendicular bisector of the corresponding chord.

20. The resonance structure of bulk acoustic wave resonator according to claim 19, wherein each circular arc is a minor arc or a semi-circle.

21. The resonance structure of bulk acoustic wave resonator according to claim 19, wherein each circular arc has the same arc length.

22. The resonance structure of bulk acoustic wave resonator according to claim 19, wherein each curved edge is a circular arc.

23. The resonance structure of bulk acoustic wave resonator according to claim 13, wherein a chord is formed by connecting two endpoints of each curved edge, a convex polygon is formed by extending all chords and connecting all the extended chords, wherein said number of said at least three curved edges is equal to a number of the sides of said convex polygon.

24. The resonance structure of bulk acoustic wave resonator according to claim 23, wherein said at least three curved edges include three curved edges, said convex polygon is a triangle, each interior angle of said convex polygon is greater than or equal to 45° and less than or equal to 90°.

25. The resonance structure of bulk acoustic wave resonator according to claim 23, wherein said at least three curved edges include four curved edges, said convex polygon is a convex quadrilateral, each interior angle of said convex polygon is greater than or equal to 60° and less than or equal to 135°.

26. The resonance structure of bulk acoustic wave resonator according to claim 23, wherein said at least three curved edges include five curved edges, said convex polygon is a convex pentagon, each interior angle of said convex polygon is greater than or equal to 65° and less than or equal to 170°.

27. The resonance structure of bulk acoustic wave resonator according to claim 13, wherein a chord is formed by connecting two endpoints of each curved edge, at least one of the curved edges is symmetric with respect to a perpendicular bisector of the corresponding chord.

28. The resonance structure of bulk acoustic wave resonator according to claim 13, wherein a chord is formed by connecting two endpoints of each curved edge, each curved edge is symmetric with respect to a perpendicular bisector of the corresponding chord.

29. The resonance structure of bulk acoustic wave resonator according to claim 13, wherein a chord is formed by connecting two endpoints of each curved edge, each curved edge is located within the range between two perpendicular lines perpendicular to the corresponding chord and passing through two endpoints of the corresponding chord respectively.

30. The resonance structure of bulk acoustic wave resonator according to claim 13, wherein each curved edge has the same curved edge length.

31. The resonance structure of bulk acoustic wave resonator according to claim 13, wherein each linking curved edge has the same linking curved edge length.

* * * * *